(12) United States Patent
Yamaguchi et al.

(10) Patent No.: US 8,541,297 B2
(45) Date of Patent: Sep. 24, 2013

(54) MANUFACTURING METHOD OF SEMICONDUCTOR DEVICE

(75) Inventors: Tadashi Yamaguchi, Kanagawa (JP); Takuya Futase, Kanagawa (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 129 days.

(21) Appl. No.: 13/046,761

(22) Filed: Mar. 13, 2011

(65) Prior Publication Data

US 2011/0237061 A1   Sep. 29, 2011

(30) Foreign Application Priority Data

Mar. 29, 2010   (JP) .................................. 2010-074775

(51) Int. Cl.
 *H01L 21/3205* (2006.01)
 *H01L 21/4763* (2006.01)
(52) U.S. Cl.
 USPC ........... 438/592; 438/296; 438/655; 438/664; 257/E21.158; 257/E21.409
(58) Field of Classification Search
 USPC ......... 438/197, 296, 592, 664, 689; 257/306, 257/338, E21.158, E21.409, E21.633
 See application file for complete search history.

(56) References Cited

U.S. PATENT DOCUMENTS

| 2007/0166977 A1* | 7/2007 | Itokawa et al. ............... 438/592 |
| 2007/0254480 A1 | 11/2007 | Matsuda et al. |
| 2008/0149980 A1* | 6/2008 | Govindarajan ............... 257/306 |
| 2008/0157660 A1* | 7/2008 | Ohyama et al. ............... 313/504 |
| 2008/0242035 A1* | 10/2008 | Futase et al. .................. 438/296 |
| 2009/0191707 A1 | 7/2009 | Okada et al. |
| 2009/0285568 A1* | 11/2009 | Kiyama et al. ................. 392/418 |
| 2010/0001287 A1* | 1/2010 | Ahn et al. ........................ 257/72 |
| 2010/0093139 A1* | 4/2010 | Futase ........................... 438/197 |

FOREIGN PATENT DOCUMENTS

| JP | 2004-521486 T | | 7/2004 |
| JP | 2005123626 A | * | 5/2005 |
| JP | 2007-299899 A | | 11/2007 |
| JP | 2009-176975 A | | 8/2009 |
| WO | WO 02/47145 A1 | | 6/2002 |

* cited by examiner

*Primary Examiner* — Charles Garber
*Assistant Examiner* — Abdulfattah Mustapha
(74) *Attorney, Agent, or Firm* — Miles & Stockbridge P.C.

(57) ABSTRACT

The present invention improves the performance of a semiconductor device wherein a metal silicide layer is formed through a salicide process. A metal silicide layer is formed over the surfaces of first and second gate electrodes, $n^+$-type semiconductor regions, and $p^+$-type semiconductor regions through a salicide process of a partial reaction type without the use of a salicide process of a whole reaction type. In a heat treatment for forming the metal silicide layer, by heat-treating a semiconductor wafer not with an annealing apparatus using lamps or lasers but with a thermal conductive annealing apparatus using carbon heaters, a thin metal silicide layer is formed with a small thermal budget and a high degree of accuracy and microcrystals of NiSi are formed in the metal silicide layer through a first heat treatment.

18 Claims, 16 Drawing Sheets

MANUFACTURING METHOD OF SEMICONDUCTOR DEVICE

CROSS-REFERENCE TO RELATED APPLICATIONS

The disclosure of Japanese Patent Application No. 2010-74775 filed on Mar. 29, 2010 including the specification, drawings and abstract is incorporated herein by reference in its entirety.

BACKGROUND OF THE INVENTION

The present invention relates to a manufacturing method of a semiconductor device, particularly to a technology that is effective when applied to the manufacturing of a semiconductor element having a metal silicide layer.

As higher integration of a semiconductor device advances, a field effect transistor (MISFET: Metal Insulator Semiconductor Field Effect Transistor) is more miniaturized according to the scaling law. On that occasion however, an arising problem is that resistance in a gate electrode and a source/drain region increases and high speed operations cannot be obtained even though a field effect transistor is miniaturized. To cope with the problem, a salicide (Self Aligned Silicide) technology, which reduces resistance in a gate electrode and a source/drain region by forming a low resistance metal silicide layer such as a nickel silicide layer or a cobalt silicide layer over the surfaces of a conductive film configuring the gate electrode and a semiconductor region configuring the source/drain region through self-aligning, is studied.

Japanese Unexamined Patent Publication No. 2004-521486 describes a technology that makes the thickness of a silicide formed at the edge of a silicon electrode substantially equal with the thickness of the center part of the electrode by a two-step annealing method. More specifically, the patent publication: describes a technology of forming $Ni_2Si$ and $Ni_3Si$ in a silicide layer through a first heat treatment (250° C. to 350° C.) with an annealing apparatus using laser annealing, lamp heating, or radiation annealing and forming nickel monosilicide in the silicide layer through a second heat treatment (350° C. to 700° C.); but does not describe that microcrystals of NiSi are formed in the silicide layer through the first heat treatment. Further, the patent publication describes that an Ni alloy film is formed as a metal film formed over a semiconductor substrate before the first heat treatment, but neither exemplifies any specific alloy film such as an Ni—Pt film nor describes that a thermal conductive annealing apparatus is used at heat treatment for forming a silicide layer.

Japanese Unexamined Patent Publication No. 2007-299899 describes a technology of forming a silicide layer including nickel monosilicide by: inhibiting surface oxidization of the silicide layer; and not increasing sheet resistance in the silicide layer. More specifically, the patent publication: describes a technology of, after forming an Ni film and a TiN film in sequence over a semiconductor substrate, forming $Ni_2Si$ in a silicide layer through a first temperature treatment (200° C. to 350° C.) by a sinter heating method and forming nickel monosilicide in the silicide layer through a second temperature treatment (370° C. to 500° C.) by the same sinter heating method; but does not describe that the microcrystals of NiSi are formed in the silicide layer through the first temperature treatment. Further, the patent publication: describes that an Ni film is used as a metal film formed over a semiconductor substrate before the first temperature treatment; but does not describe that an Ni alloy film such as an Ni—Pt film is formed.

Japanese Unexamined Patent Publication No. 2009-176975 describes a technology of forming a nickel platinum silicide layer through a salicide process of a whole reaction type.

SUMMARY OF THE INVENTION

As a semiconductor device is miniaturized, the reduction of the thickness of a silicide layer formed at the upper planes of a source/drain region and a gate electrode of a field effect transistor is required. If the thickness of a silicide layer reduces however, the stability of the silicide layer is physically hindered, the silicide layer grows abnormally in a semiconductor substrate, and a silicide layer mainly containing $NiSi_2$ is formed in the semiconductor substrate at the bottom of a gate electrode. On this occasion, leak defects caused by junction leakage current increase, the reliability of a semiconductor device may be hindered, and hence the thickness of the silicide layer has hardly been reduced.

In recent years, in a salicide process for forming a silicide layer, a method for applying annealing treatment (heat treatment) two times separately in order to form the silicide layer by reacting a metal film formed over a semiconductor substrate with parts of a source region, a drain region, and a gate electrode is generally used. On this occasion, the semiconductor substrate is heated at a higher temperature in a second annealing process than in a first annealing process.

As shown in Japanese Unexamined Patent Publication No. 2009-176975, in a conventional salicide process, a salicide process of a whole reaction type of forming a silicide layer by reacting the whole part of a metal film formed at the upper planes of a source/drain region and a gate electrode in an annealing apparatus using a lamp has been used. This method, however, requires a long heating time, hence the sizes (grain sizes) of crystals configuring the silicide layer increase through the long time heating, and that is one of the things that cause the silicide layer to grow abnormally up to the interior of the semiconductor substrate.

A first object of the present invention is to provide a technology that can improve the performance of a semiconductor device.

A second object of the present invention is to provide a technology that can improve the reliability of a semiconductor device.

The objects described above, other objects, and novel features of the present invention will be obvious from the descriptions and the attached drawings in this specification.

The representative outline of the invention disclosed in the present application is briefly explained as follows.

That is, a manufacturing method of a semiconductor device according to the present applied invention: is a method of forming a metal film over a semiconductor substrate after forming a semiconductor region in the semiconductor substrate, forming a metal silicide layer by reacting the metal film with the semiconductor region through a first heat treatment, thereafter removing the unreacted metal film, and applying a second heat treatment at a higher heat treatment temperature than in the first heat treatment; and is characterized in that the temperature-rise rate at the first heat treatment is 250° C./sec. to 500° C./sec.

Effects obtained from the representative part of the invention disclosed in the present application are briefly explained as follows.

According to a representative embodiment, the present invention can improve the performance of a semiconductor device.

Further, the present invention can improve the reliability of a semiconductor device having a field effect transistor wherein a metal silicide layer is formed over the surface of a source/drain region.

BRIEF DESCRIPTION OF THE DRAWINGS

FIG. 18($b$) is a graph showing a relationship between a temperature of a semiconductor wafer and a time in a first heat treatment according to the present embodiment.

FIG. 27($b$) is an enlarged sectional view showing a substantial part of a semiconductor device during heat treatment under the same conditions as those in FIG. 26.

DETAILED DESCRIPTION OF THE PREFERRED EMBODIMENTS

In the following embodiment, a plurality of sections or embodiments are explained separately for convenience when it is needed but, unless otherwise specified, they are not unrelated to each other and one is related to a modified example, a detail, a supplemental explanation, or the like of a part or the whole of another. Further, when the number of elements and others (including the number of pieces, a numerical value, a quantity, and a range) are described in the following embodiment, the numbers are not limited to the specific numbers and may be larger or smaller than the specific numbers except the case of being clearly specified and the case of being limited to the specific numbers clearly in principle. Moreover, it goes without saying that, in the following embodiment, constituent components (including component steps) are not always essential except the case of being clearly specified and the case of being considered as essential clearly in principle. Likewise, when the shapes and positional relations of the constituent components and the like are described in the following embodiment, the shapes and others include those substantially close or similar to the shapes and others except the case of being clearly specified and the case of being considered as otherwise clearly in principle. The same is applied also to the numerical value and the range described above.

An embodiment according to the present invention is hereinafter explained in detail in reference to drawings. Here, in all the drawings for explaining the embodiment, members having the same functions are represented with the same reference symbols respectively and the repetition of explanations is omitted. In the following embodiment, identical or similar portions are not explained repeatedly in principle except when they are specifically needed.

Manufacturing processes of a semiconductor device according to the present embodiment are explained in reference to drawings. FIGS. 1 to 8 are sectional views showing a substantial part of a semiconductor device, for example a semiconductor device having a CMISFET (Complementary Metal Insulator Semiconductor Field Effect Transistor), according to the embodiment of the present invention in manufacturing processes.

Figure 1:
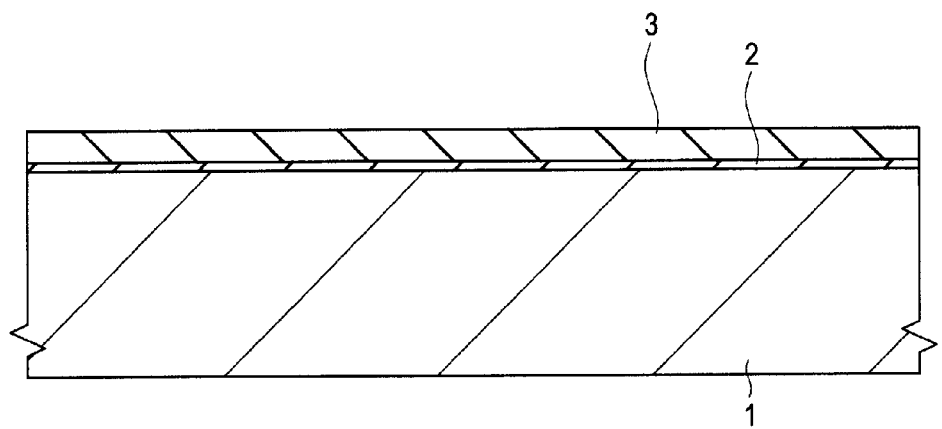
FIG. 1 is a sectional view showing a substantial part of a semiconductor device in a manufacturing process according to an embodiment of the present invention.
Figure 2:
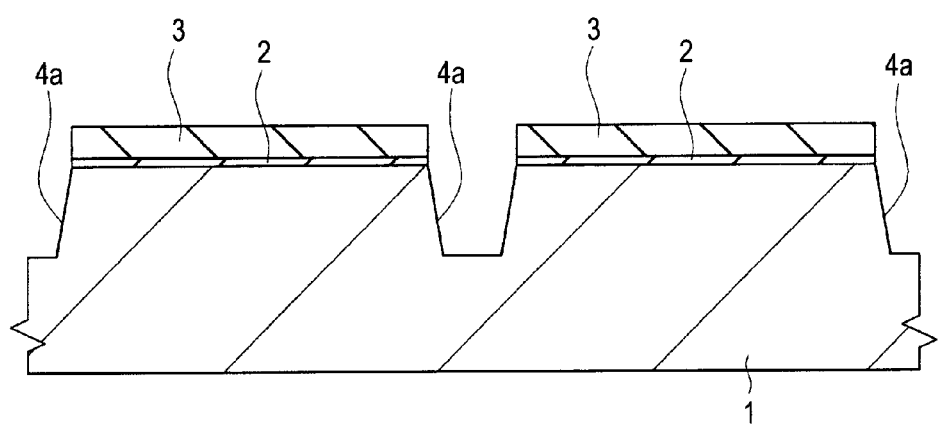
FIG. 2 is a sectional view showing the substantial part of the semiconductor device in a manufacturing process following the manufacturing process shown in FIG. 1.

Firstly, as shown in FIG. 1, a semiconductor substrate (semiconductor wafer) 1 comprising p-type monocrystal silicon having a resistivity of about 1 to 10 Ωcm for example is prepared. Successively, an insulation film 2 about 11 nm in thickness for example is formed over the surface of the semiconductor substrate 1 by thermally oxidizing the semiconductor substrate 1 and thereafter an insulation film 3 about 90 nm in thickness for example is deposited over the upper layer thereof by a CVD (Chemical Vapor Deposition) method or the like. The insulation film 2 comprises silicon oxide or the like and the insulation film 3 comprises a silicon nitride film or the like. Then, as shown in FIG. 2, a trench (trench for isolating elements) 4a about 300 nm in depth for example is formed in the semiconductor substrate 1 in the region where element isolation is to be applied by dry-etching the insulation film 3, the insulation film 2, and the semiconductor substrate 1 in sequence using a photoresist pattern (not shown in the figure) as an etching mask. The trench 4a is a trench for isolating elements, namely a trench for forming an element isolation region 4 that will be described later.

Figure 3:
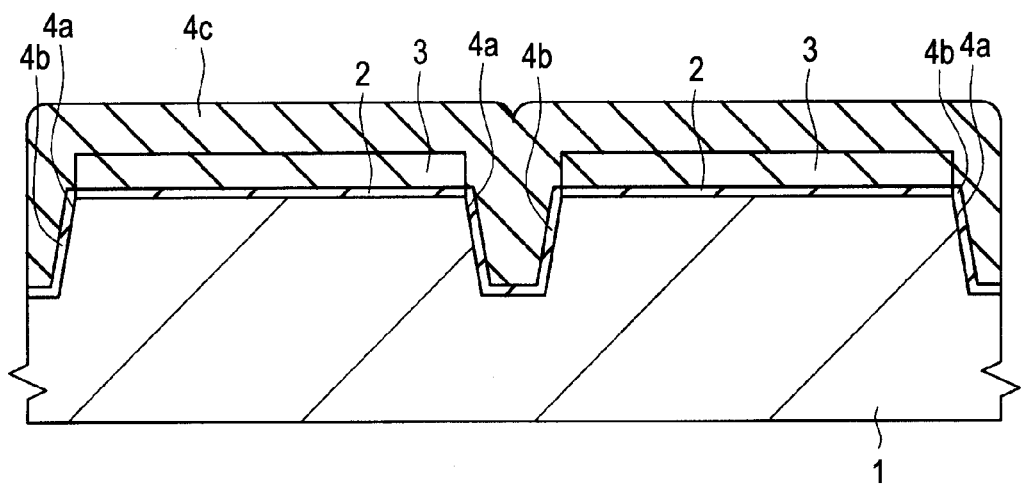
FIG. 3 is a sectional view showing the substantial part of the semiconductor device in a manufacturing process following the manufacturing process shown in FIG. 2.

Successively, as shown in FIG. 3, an insulation film 4b about 10 nm in thickness for example is formed over the main surface of the semiconductor substrate 1 including the interior of the trench 4a (the sidewall and the bottom). Then, an insulation film 4c is formed (deposited) over the main surface of the semiconductor substrate 1 (namely, over the insulation film 4b) so as to fill the trench 4a by a CVD method or the like.

The insulation film 4b comprises a silicon oxide film or a silicon oxynitride film. The insulation film 4b comprising a silicon oxynitride film has the effect of: preventing volume expansion caused by the oxidization of the sidewall of the trench 4a through heat treatments applied after the process of forming the insulation film 4b; and reducing compression stress acting on the semiconductor substrate 1.

The insulation film 4c comprises a silicon oxide film formed by an HDP-CVD (High Density Plasma CVD) method or an $O_3$-TEOS oxidized film. Here, the $O_3$-TEOS oxidized film is a silicon oxide film formed by a thermal CVD method using $O_3$ (ozone) and TEOS (tetraethoxysilane, also called Tetra Ethyl Ortho Silicate) as source gases.

Then, the insulation film 4c embedded into the trench 4a is densified by heat-treating the semiconductor substrate 1 at about 1,150° C. for example. In the state before the densification, the silicon oxide film formed by the HDP-CVD method is denser than the $O_3$-TEOS oxidized film. Consequently, in the case where the insulation film 4c comprises the $O_3$-TEOS oxidized film, the insulation film 4c has the effect of reducing compression stress acting on the semiconductor substrate 1 because of the shrinkage of the insulation film 4c caused by the densification. In contrast, in the case where the insulation film 4c comprises the silicon oxide film formed by the HDP-CVD method, the shrinkage of the insulation film 4c caused by the densification is smaller than the case where the insulation film 4c comprises the $O_3$-TEOS oxidized film and hence the compression stress acting on the semiconductor substrate 1 by the element isolation region 4 increases.

Figure 4:
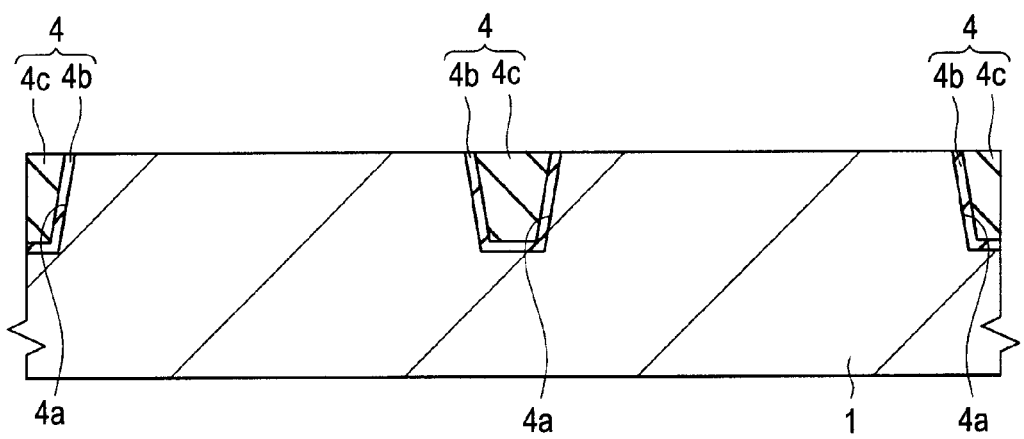
FIG. 4 is a sectional view showing the substantial part of the semiconductor device in a manufacturing process following the manufacturing process shown in FIG. 3.

Successively, as shown in FIG. 4, the element isolation region (element isolation) 4 is formed by: polishing the insulation film 4c by a CMP (Chemical Mechanical Polishing) method and exposing the insulation film 3; removing the insulation film 3 by wet etching using thermal phosphate or the like; and thereafter removing the insulation film 4c and the insulation film 2 outside the trench 4a with HF or the like and leaving the insulation films 4b and 4c inside the trench 4a.

In this way, the element isolation region 4 comprising the insulation films 4b and 4c embedded into the trench 4a is formed. In the present embodiment, the element isolation region 4 is formed not by a LOCOS (Local Oxidization of Silicon) method but preferably by an STI (Shallow Trench Isolation) method. That is, the element isolation region 4 according to the present embodiment preferably comprises an insulation material (here, the insulation films 4b and 4c) embedded into the trench 4a for element isolation formed in the semiconductor substrate 1. An n-channel MISFETQn (that is, a gate insulation film 7, a gate electrode 8a, and $n^-$-type semiconductor regions 9a and $n^+$-type semiconductor regions 9b for source/drain configuring an n-channel MISFETQn) that will be described later is formed in an active region regulated (surrounded) by the element isolation region 4. Likewise, a p-channel MISFETQp (that is, a gate insulation film 7, a gate electrode 8b, and $p^-$-type semiconductor regions 10a and $p^+$-type semiconductor regions 10b for source/drain configuring a p-channel MISFETQp) that will be described later is formed also in an active region regulated (surrounded) by the element isolation region 4.

Figure 5:
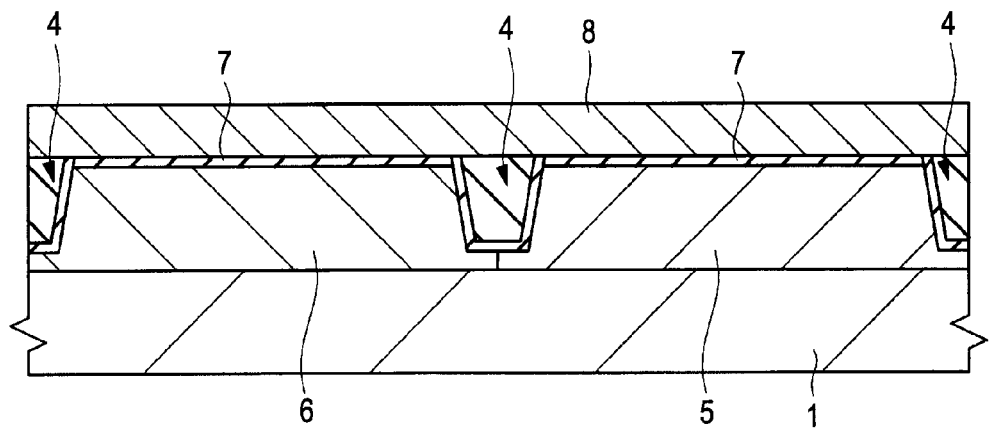
FIG. 5 is a sectional view showing the substantial part of the semiconductor device in a manufacturing process following the manufacturing process shown in FIG. 4.

Successively, as shown in FIG. 5, a p-type well 5 and an n-type well 6 are formed from the main surface of the semiconductor substrate 1 down to a prescribed depth. The p-type well 5 can be formed by using a photoresist film (not shown in the figure) covering a region where the p-channel MISFET is to be formed as a mask for preventing ion implantation and ion-implanting p-type impurities such as boron (B) into the semiconductor substrate 1 in a region where the n-channel MISFET is to be formed. Likewise, the n-type well 6 can be formed by using another photoresist film (not shown in the figure) covering a region where the n-channel MISFET is to be formed as a mask for preventing ion implantation and ion-implanting n-type impurities such as phosphorus (P) or arsenic (As) into the semiconductor substrate 1 in a region where the p-channel MISFET is to be formed.

Successively, the surface of the semiconductor substrate 1 is cleaned (rinsed) by wet etching using hydrofluoric acid (HF) for example and then a gate insulation film 7 is formed over the surface of the semiconductor substrate 1 (namely, the surfaces of the p-type well 5 and the n-type well 6). The gate insulation film 7 comprises a thin silicon oxide film for example and can be formed by a thermal oxidization method or the like.

Successively, a silicon film 8 such as a polycrystalline silicon film is formed as a conducting film for forming a gate electrode over the semiconductor substrate 1 (namely, over the gate insulation film 7 over the p-type well 5 and the n-type well 6). The region in the silicon film 8 where the n-channel MISFET is to be formed (a region which is to be a gate electrode 8a described below) turns to a low resistivity n-type semiconductor film (doped polysilicon film) by using a photoresist film (not shown in the figure) as a mask and ion-implanting n-type impurities such as phosphorus (P) or arsenic (As). Likewise, the region in the silicon film 8 where the p-channel MISFET is to be formed (a region which is to be a gate electrode 8b described below) turns to a low resistivity p-type semiconductor film (doped polysilicon film) by using another photoresist film (not shown in the figure) as a mask and ion-implanting p-type impurities such as boron (B). Further, it is also possible to transform the silicon film 8, which was an amorphous silicon film when it was formed, into a polycrystalline silicon film through heat treatment after film forming (after ion implantation).

Figure 6:
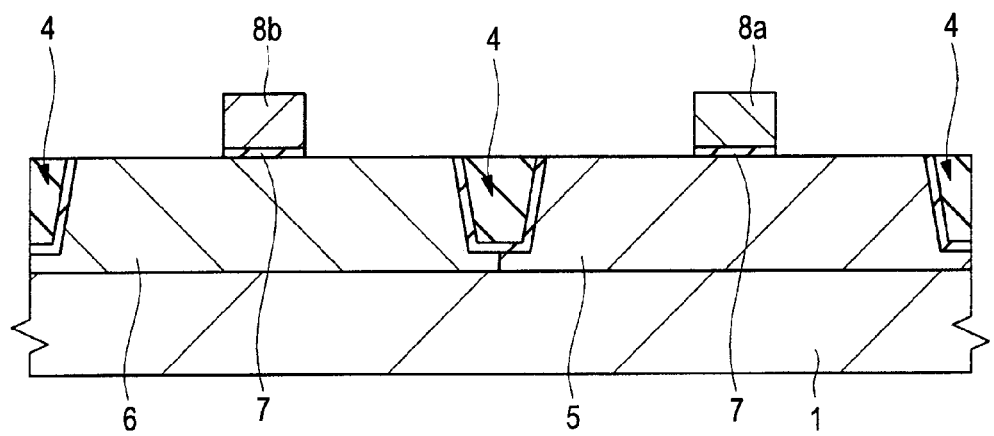
FIG. 6 is a sectional view showing the substantial part of the semiconductor device in a manufacturing process following the manufacturing process shown in FIG. 5.

Successively, as shown in FIG. 6, gate electrodes 8a and 8b are formed by patterning the silicon film 8 by a photolithographic method and a dry etching method.

The gate electrode 8a acting as a gate electrode of an n-channel MISFET: comprises polycrystalline silicon (an n-type semiconductor film, a doped polysilicon film) into which n-type impurities are implanted; and is formed over the p-type well 5 while the gate insulation film 7 is interposed between them. That is, the gate electrode 8a is formed over the gate insulation film 7 over the p-type well 5. Likewise, the gate electrode 8b acting as a gate electrode of a p-channel MISFET: comprises polycrystalline silicon (a p-type semiconductor film, a doped polysilicon film) into which p-type impurities are implanted; and is formed over the n-type well 6 while the gate insulation film 7 is interposed between them. That is, the gate electrode 8b is formed over the gate insulation film 7 over the n-type well 6. The gate lengths of the gate electrodes 8a and 8b can be changed according to needs and may be about 50 nm for example.

Figure 7:
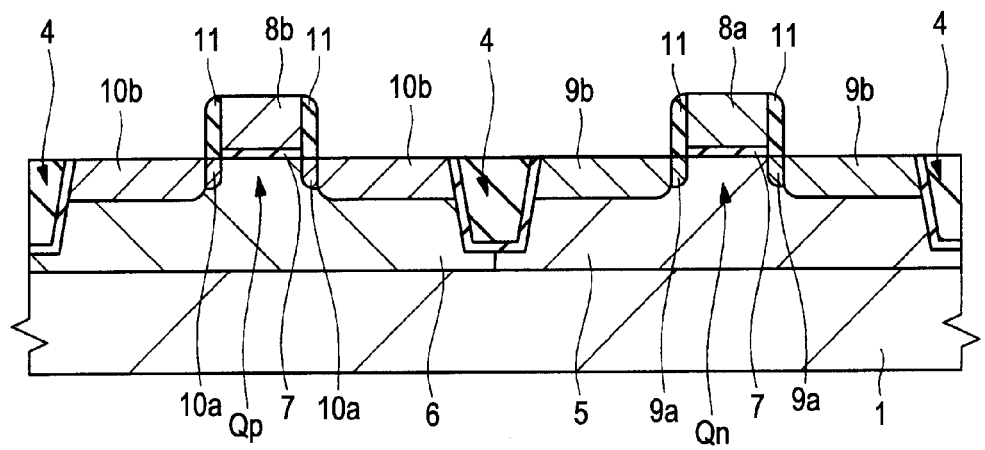
FIG. 7 is a sectional view showing the substantial part of the semiconductor device in a manufacturing process following the manufacturing process shown in FIG. 6.

Successively, as shown in FIG. 7, (a pair of) n$^-$-type semiconductor regions 9a are formed by ion-implanting n-type impurities such as phosphorous (P) or arsenic (As) into the regions of the p-type well 5 on both sides of the gate electrode 8a, and (a pair of) p$^-$-type semiconductor regions 10a are formed by ion-implanting p-type impurities such as boron (B) into the regions of the n-type well 6 on both sides of the gate electrode 8b. Depths (junction depths) of the n$^-$-type semiconductor regions 9a and the p$^-$-type semiconductor regions 10a can be about 30 nm for example.

Successively, sidewall spacers or sidewalls (sidewall insulation films) 11 comprising for example silicon oxide, silicon nitride, or a laminated film comprising those insulation films are formed as an insulation film over the sidewalls of the gate, electrodes 8a and 8b. The sidewalls 11 can be formed for example by: depositing a silicon oxide film, a silicon nitride film, or a laminated film comprising those films over the semiconductor substrate 1; and anisotropically etching the silicon oxide film, the silicon nitride film, or the laminated film comprising those films by an RIE (Reactive Ion Etching) method or the like.

After the sidewalls 11 are formed, (a pair of) n$^+$-type semiconductor regions 9b (source and drain regions) are formed for example by ion-implanting n-type impurities such as phosphorus (P) or arsenic (As) into the regions of the p-type well 5 on both sides of the gate electrode 8a and the sidewalls 11. For example, phosphorus (P) is implanted by about $5 \times 10^{15}/\text{cm}^2$ or arsenic (As) is implanted by about $4 \times 10^{15}/\text{cm}^2$. Likewise, (a pair of) p$^+$-type semiconductor regions 10b (source and drain regions) are formed for example by ion-implanting p-type impurities such as boron (B) into the regions of the n-type well 6 on both sides of the gate electrode 8b and the sidewalls 11. For example, boron (B) is implanted by about $4 \times 10^{15}/\text{cm}^2$. Either the n$^+$-type semiconductor regions 9b or the p$^+$-type semiconductor regions 10b may be formed first. After the ion-implantation, an annealing treatment for activating the implanted impurities can be applied by a spike annealing treatment at a temperature of about 1,050° C. for example. Depths (junction depths) of the n$^+$-type semiconductor regions 9b and the p$^+$-type semiconductor regions 10b can be about 80 nm for example.

An impurity density in the n$^+$-type semiconductor regions 9b is higher than that in the n$^-$-type semiconductor regions 9a, and an impurity density in the p$^+$-type semiconductor regions 10b is higher than that in the p$^-$-type semiconductor regions 10a. Thus, an n-type semiconductor region (impurity diffusion layer) functioning as a source or a drain of an n-channel MISFET is formed with the n$^+$-type semiconductor regions (impurity diffusion layers) 9b and the n$^-$-type semiconductor regions 9a, and a p-type semiconductor region (impurity diffusion layer) functioning as a source or a drain of a p-channel MISFET is formed with the p$^+$-type semiconductor regions (impurity diffusion layers) 10b and the p$^-$-type semiconductor regions 10a. Consequently, the source/drain regions of the n-channel MISFET and the p-channel MISFET have an LDD (Lightly doped Drain) structure. The n$^-$-type semiconductor regions 9a are formed so as to be self-aligned with the gate electrode 8a, and the n$^+$-type semiconductor regions 9b are formed so as to be self-aligned with the sidewalls 11 formed over the sidewalls of the gate electrode 8a. The p$^-$-type semiconductor regions 10a are formed so as to be self-aligned with the gate electrode 8b, and the p$^+$-type semiconductor regions 10b are formed so as to be self-aligned with the sidewalls 11 formed over the sidewalls of the gate electrode 8b.

In this way, an n-channel MISFET (Metal Insulator Semiconductor Field Effect Transistor) Qn is formed as a field effect transistor in the p-type well 5. Likewise, a p-channel MISFET (Metal Insulator Semiconductor Field Effect Transistor) Qp is formed as a field effect transistor in the n-type well 6. Thus, the structure shown in FIG. 7 is obtained. The n-channel MISFETQn can be regarded as an n-channel field effect transistor, and the p-channel MISFETQp can be regarded as a p-channel field effect transistor. Further, the n$^+$-type semiconductor regions 9b can be regarded as semiconductor regions for a source or a drain in the n-channel MISFETQn, and the p$^+$-type semiconductor regions 10b can be regarded as semiconductor regions for a source or a drain in the p-channel MISFETQp.

Successively, by a salicide (Salicide: Self Aligned Silicide) technology, a metal silicide layer of a low resistance (corresponding to a metal silicide layer 41 described below) is formed over: the surfaces of the gate electrode 8a and a source/drain region (here, the n$^+$-type semiconductor regions 9b) of the n-channel MISFETQn; and the surfaces of the gate electrode 8b and a source/drain region (here, the p$^+$-type semiconductor regions 10b) of the p-channel MISFETQp. A salicide process of a partial reaction type is used as a salicide process in the present embodiment and processes for forming the metal silicide layer are explained hereunder.

Figure 8:
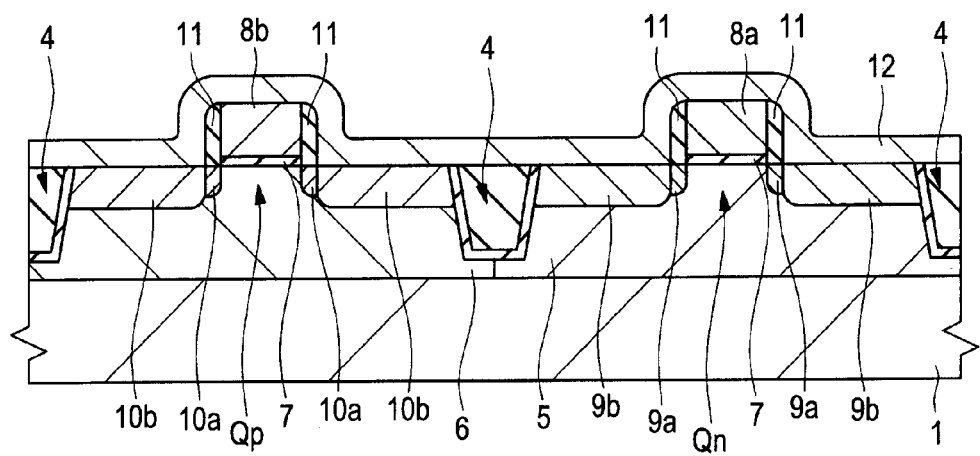
FIG. 8 is a sectional view showing the substantial part of the semiconductor device in a manufacturing process following the manufacturing process shown in FIG. 7.

FIG. 8 is a sectional view showing the substantial part of the semiconductor device in a manufacturing process following the manufacturing process shown in FIG. 7. FIGS. 9, 10, and 19 to 21 are sectional views showing the substantial part of the semiconductor device in manufacturing processes following the manufacturing process shown in FIG. 8.

After the structure shown in FIG. 7 is obtained as described above, as shown in FIG. 8, the surfaces of the gate electrodes 8a and 8b, the n$^+$-type semiconductor regions 9b, and the p$^+$-type semiconductor regions 10b are exposed and then a metal film 12 is formed (deposited) over the main surface (whole plane) of the semiconductor substrate 1 including over the gate electrodes 8a and 8b, the n$^+$-type semiconductor regions 9b, and the p$^+$-type semiconductor regions 10b by a sputtering method for example. That is, a metal film 12 is formed over the semiconductor substrate 1 including over the n$^+$-type semiconductor regions 9b and the p$^+$-type semiconductor regions 10b so as to cover the gate electrodes 8a and 8b.

Further, it is still preferable to: remove a naturally formed oxide film over the surfaces of the gate electrodes 8a and 8b, the n$^+$-type semiconductor regions 9b, and the p$^+$-type semiconductor regions 10b through a dry cleaning treatment using at least one of an HF gas, an NF$_3$ gas, and an H$_2$ gas before the process of depositing the metal film 12; and thereafter apply the process of depositing the metal film 12 without exposing the semiconductor substrate 1 to the atmosphere (atmosphere containing oxygen).

The metal film 12 comprises an Ni (nickel)—Pt (platinum) alloy film (an alloy film of Ni and Pt) for example and the thickness (thickness of the deposited film) can be about 15 nm to 40 nm for example. Here, the concentration of Pt (platinum) in the metal film 12 is set at 3 at % to 10 at % for example.

Figure 9:
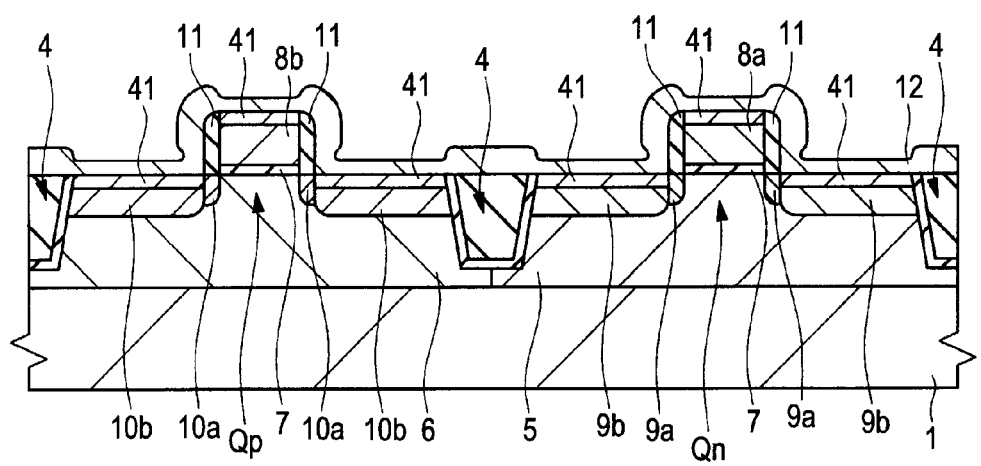
FIG. 9 is a sectional view showing the substantial part of the semiconductor device in a manufacturing process following the manufacturing process shown in FIG. 8.

After the metal film 12 is formed in this way, as shown in FIG. 9, a first heat treatment (first annealing treatment) is applied to the semiconductor substrate 1. Here, the first heat treatment is preferably applied at 250° C. to 300° C. For example, the first heat treatment can be applied to the semiconductor substrate 1 for about 30 sec. at a temperature of about 280° C. in an atmosphere of an inert gas or a nitrogen gas with a sheet-type thermal conductive annealing apparatus described below by an RTA (Rapid Thermal Anneal) method. On this occasion, it is preferable to set a temperature-rise rate (rate of temperature rise per unit time) at a high rate (about 250° C./sec. to 300° C./sec.) in order to shorten the time for heating the metal film 12 at temperatures lower than a target temperature (here 280° C.) of the heat treatment to the utmost and bring the temperature of the semiconductor substrate 1 to the target temperature quickly. Here, the thermal conductive annealing apparatus described below can raise the temperature of a semiconductor wafer to about 500° C. for one second and hence the temperature-rise rate of the first heat treatment may be set at 250° C./sec. to 500° C./sec.

Through the first heat treatment, as shown in FIG. 9, a metal silicide layer 41 as a metal/semiconductor reacted layer is formed by selectively reacting the metal film 12 with a polycrystalline silicon film configuring the gate electrodes 8a and 8b and the metal film 12 with monocrystal silicon configuring the $n^+$-type semiconductor regions 9b and the $p^+$-type semiconductor regions 10b. On this occasion, in the Ni—Pt alloy film in the metal film 12, the Ni—Pt alloy in the range of 5 nm to 8 nm from the side of the bottom plane touching the semiconductor substrate 1 (the upper parts of the gate electrodes 8a and 8b, the $n^+$-type semiconductor regions 9b, and the $p^+$-type semiconductor regions 10b) toward the direction of the upper plane on the other side reacts with the upper parts of the gate electrodes 8a and 8b, the $n^+$-type semiconductor regions 9b, and the $p^+$-type semiconductor regions 10b. Thus, the metal silicide layer 41 that is a metal-rich phase containing Pt and $Ni_2Si$ (dinickel silicide) and has microcrystals (substance acting as the nuclei of crystals) of NiSi (nickel monosilicide) is formed at the upper parts of the gate electrodes 8a and 8b, the $n^+$-type semiconductor regions 9b, and the $p^+$-type semiconductor regions 10b respectively. Here, the metal-rich phase described here is a phase comprising not a compound in which Si atoms and metal atoms are combined at a ratio of 1 to 1 like NiSi but a compound in which plural metallic atoms are combined with Si like $Ni_2Si$ or $Ni_3Si$.

That is, in the metal film 12 formed in a thickness of 15 nm to 40 nm over the semiconductor substrate 1 in the process shown in FIG. 8, only a part of the whole thickness of the metal film 12 at the upper parts of the gate electrodes 8a and 8b, the $n^+$-type semiconductor regions 9b, and the $p^+$-type semiconductor regions 10b turns to the metal silicide layer 41 shown in FIG. 9 by reacting with the upper parts of the gate electrodes 8a and 8b, the $n^+$-type semiconductor regions 9b, and the $p^+$-type semiconductor regions 10b respectively through the first heat treatment. Consequently, as shown in FIG. 9, the thickness of the metal film 12 at the upper parts of the gate electrodes 8a and 8b, the $n^+$-type semiconductor regions 9b, and the $p^+$-type semiconductor regions 10b over the semiconductor substrate 1 where the metal silicide layer 41 is formed is thinner than the thickness of the metal film 12 in the other regions. A salicide process in which a metal silicide layer 41 is formed by reacting only a necessary quantity and a part in thickness of the metal film 12 in this way is called a salicide process of a partial reaction type here.

Meanwhile, Pt is added in the metal film 12 in the present embodiment. This is because, when a nickel silicide layer is used as a metal silicide layer, it is possible to reduce the cohesion of the formed metal silicide layer and inhibit the abnormal growth of $NiSi_2$ crystals in the formed metal silicide layer by adding Pt or the like into the nickel silicide layer (metal silicide layer 41). Further, by adding Pt into the metal film 12, the crystals of NiSi having smaller crystal grain sizes are likely to be formed in a metal silicide layer 41 formed through the first heat treatment.

In this way, in the first heat treatment of the present embodiment, not a salicide process of a whole reaction type wherein the whole metal film 12 formed over the semiconductor substrate 1 reacts at the upper parts of the gate electrodes 8a and 8b, the $n^+$-type semiconductor regions 9b, and the $p^+$-type semiconductor regions 10b respectively but a salicide process of a partial reaction type wherein a metal silicide layer 41 is formed by reacting only a necessary quantity and a part in thickness of the metal film 12 is used. The salicide process of a whole reaction type is explained later in reference to FIGS. 22 to 24.

In a salicide process of a whole reaction type described below, the amount of reaction (thickness of the metal silicide layer 41) between the metal film 12 and the gate electrodes 8a and 8b, the $n^+$-type semiconductor regions 9b, and the $p^+$-type semiconductor regions 10b is controlled by the thickness of the metal film 12 formed before the first heat treatment. In contrast, in a salicide process of a partial reaction type used in the present embodiment, it is possible to control the amount of reaction (thickness of the metal silicide layer 41) between the metal film 12 and the gate electrodes 8a and 8b, the $n^+$-type semiconductor regions 9b, and the $p^+$-type semiconductor regions 10b by a temperature and a time for heating the semiconductor substrate 1 in the first heat treatment. Consequently, a feature of a salicide process of a partial reaction type is that a silicide layer having a thin thickness of 15 nm or less can be formed more easily than a salicide process of a whole reaction type. Further, by using a salicide process of not a whole reaction type but a partial reaction type, it is possible to contain Pt (platinum) at a higher concentration in a metal silicide layer 41 formed through the first heat treatment.

Figure 10:
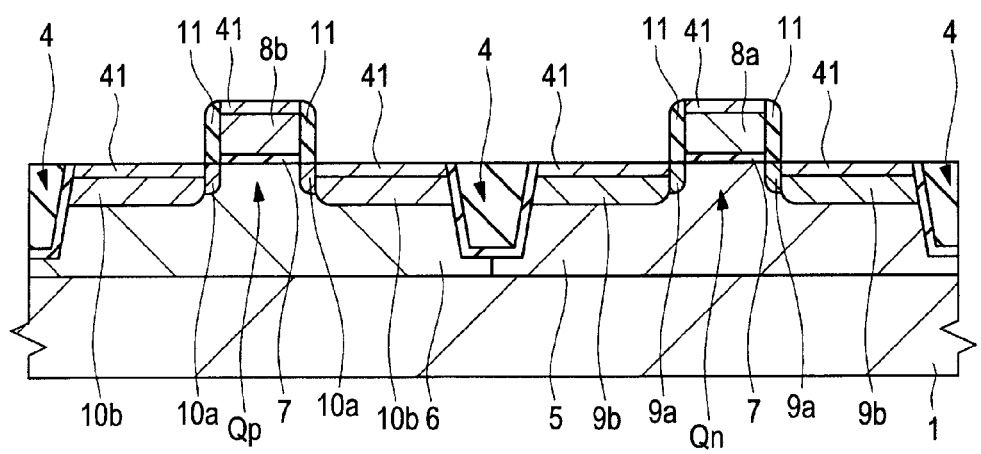
FIG. 10 is a sectional view showing the substantial part of the semiconductor device in a manufacturing process following the manufacturing process shown in FIG. 9.

Successively as shown in FIG. 10, the unreacted metal film 12 (namely, the metal film 12 that has not reacted with the gate electrodes 8a and 8b, the $n^+$-type semiconductor regions 9b, or the $p^+$-type semiconductor regions 10b) is removed by applying wet cleaning. On this occasion, the metal silicide layer 41 remains over the surfaces of the gate electrodes 8a and 8b, the $n^+$-type semiconductor regions 9b, and the $p^+$-type semiconductor regions 10b. As the wet cleaning, wet cleaning with sulfuric acid, wet cleaning with an SPM (Sulfuric acid Hydrogen Peroxide Mixture: a mixed liquid of sulfuric acid and hydrogen peroxide water), or the like can be used.

Thereafter, a second heat treatment (second annealing treatment) is applied to the semiconductor substrate 1. The second heat treatment is applied at a heat treatment temperature higher than the heat treatment temperature at the first heat treatment. The second heat treatment can be done for example by applying heat treatment to the semiconductor substrate 1 for a short period of time of about 5 sec. (spike annealing) or for about 30 sec. (soak annealing) at about 500° C. to 600° C. in an inert or nitrogen gas atmosphere by an RTA method. In the present embodiment, the second heat treatment is applied with a sheet-type thermal conductive annealing apparatus in the same way as the first heat treatment.

By applying the second heat treatment, it is possible to change the whole metal silicide layer 41 mainly containing the metal rich phase comprising $Ni_2Si$ or $Ni_3Si$ into an NiSi phase. Here, NiSi has a lower resistivity than $Ni_2Si$ or $Ni_3Si$ has, the metal silicide layer 41 remains as NiSi of a low resistance even after the second heat treatment (until the end of the manufacturing of a semiconductor device), and the metal silicide layer 41 is in the state of NiSi of a low resistance in a manufactured semiconductor device (even when the semiconductor substrate 1 is divided and in the state of semiconductor chips, for example).

Here, in the present embodiment wherein a metal silicide layer 41 having a film thickness of about 15 nm is formed, the average crystal grain size of NiSi in the metal silicide layer 41 after the second heat treatment is 100 nm or less in the case of, an n-channel MISFETQn and 200 nm or less in the case of a p-channel MISFETQp. That is, the average crystal grain size of NiSi microcrystals formed in a metal silicide layer 41 in the present embodiment is about 20 to 30 nm and hence the crystal grain sizes of NiSi formed at the first heat treatment are not more than one-third of the crystal grain sizes of NiSi after the second heat treatment. A crystal grain size cited here means the diameter of a crystal in a direction along the main surface of a semiconductor substrate 1.

Here, a sheet-type thermal conductive annealing apparatus used for the first and second heat treatments in the present embodiment is explained in reference to FIGS. 11 to 14. Since a thermal conductive annealing apparatus shown in FIGS. 11 to 14 is a sheet type, semiconductor wafers are charged one by one in an annealing furnace of the annealing apparatus and heat-treated unlike a batch-type annealing apparatus wherein plural silicon wafers are annealed simultaneously in a furnace.

Figure 11:
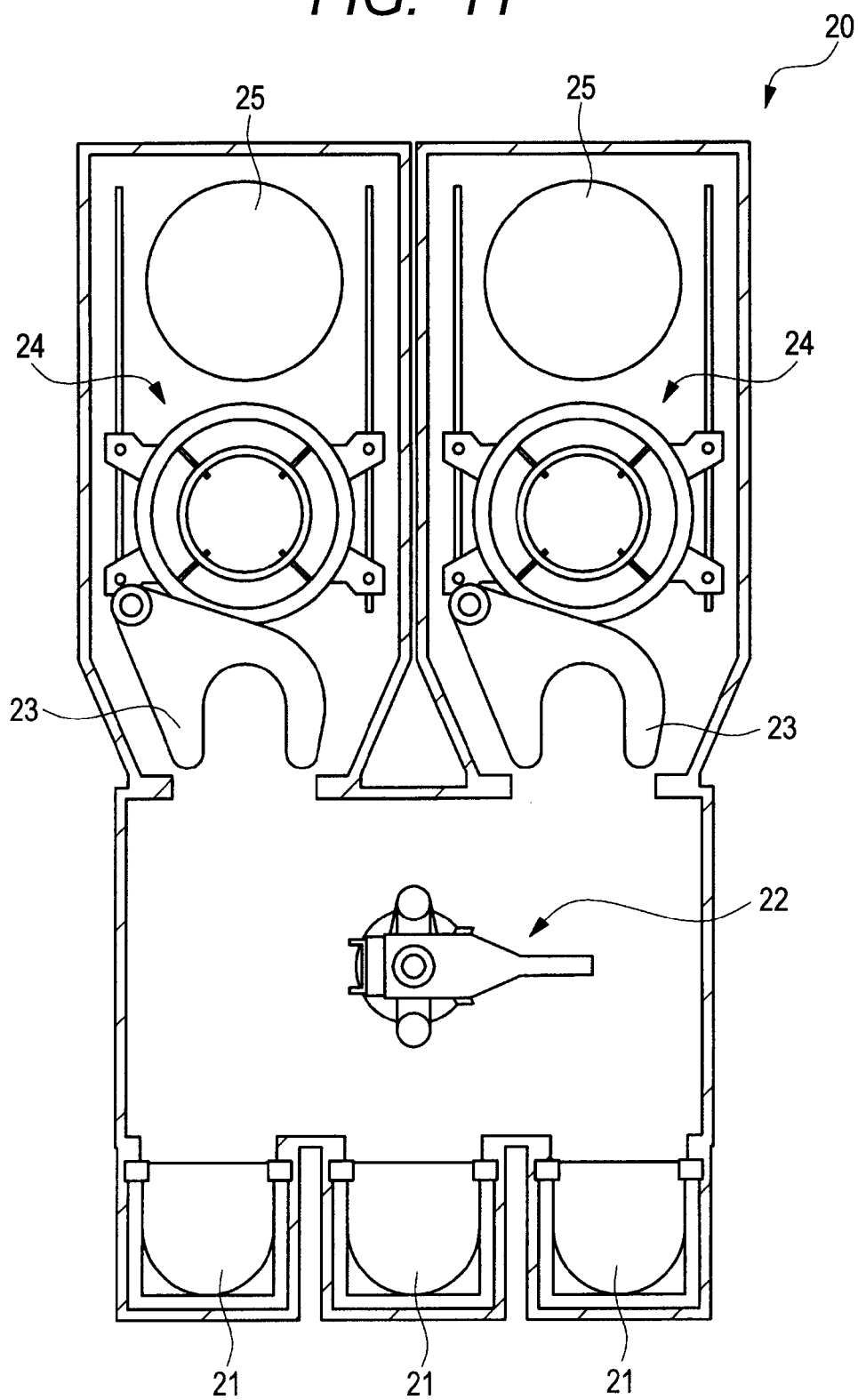
FIG. 11 is a sectional view showing a part in a fractured state of a thermal conductive annealing apparatus according to an embodiment of the present invention.

FIG. 11 is a sectional plan view showing a substantial part in a fractured state of a thermal conductive annealing apparatus. A thermal conductive annealing apparatus 20 has load ports 21 to convey a semiconductor wafer into the thermal conductive annealing apparatus 20, a robot arm 22 to transfer a semiconductor wafer in the thermal conductive annealing apparatus 20, swappers 23, carrier plates 24, and reactors 25 to heat a semiconductor wafer. In the process of applying heat treatment with the thermal conductive annealing apparatus 20, firstly a semiconductor wafer is conveyed into the thermal conductive annealing apparatus 20 with a load port and thereafter transferred from the load port to a swapper 23 comprising two sheets of opposing plates with the robot arm 22. Thereafter the semiconductor wafer is mounted on a carrier plate 24 with the swapper 23 and the carrier plate 24 moves between the reactors 25 comprising two sheets of carbon heaters while the semiconductor wafer is mounted. Thereafter, the semiconductor wafer is heat-treated with the reactors 25, thereafter cooled on the carrier plate 24, returned to the load port 21 with the carrier plate 24, the swapper 23, and the robot arm 22 through the procedure opposite to the above conveyance procedure, and carried outside the thermal conductive annealing apparatus 20 with the load port 21.

Figure 12:
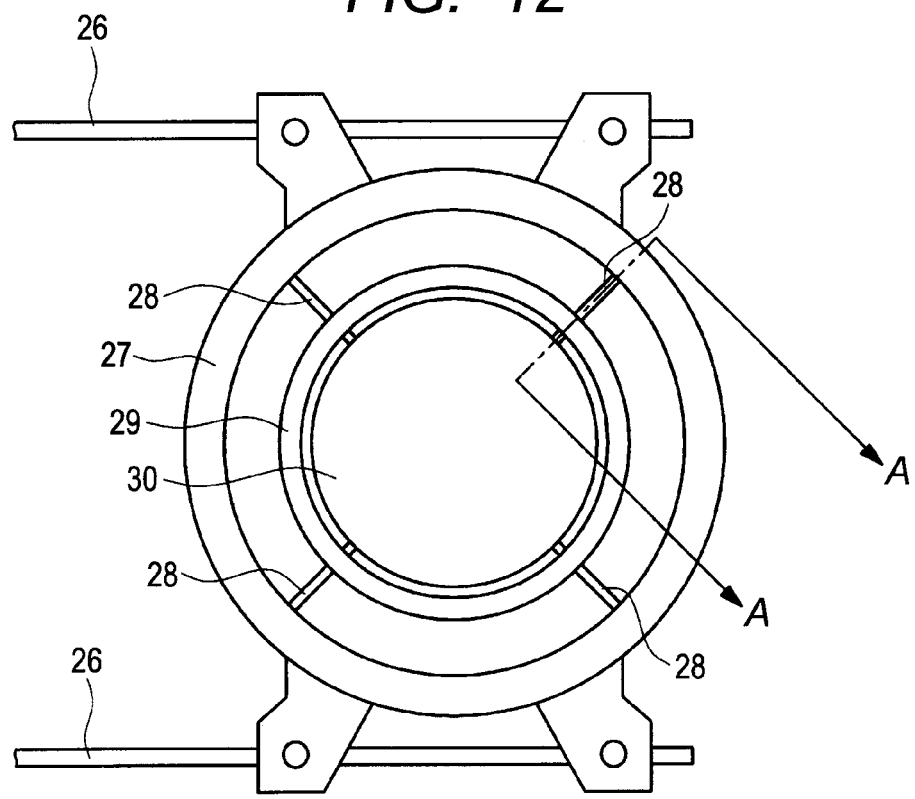
FIG. 12 is a plan view showing a part of the thermal conductive annealing apparatus according to an embodiment of the present invention.
Figure 13:
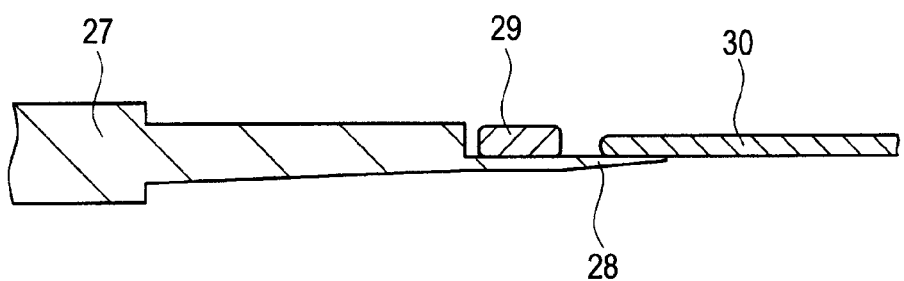
FIG. 13 is a sectional view taken on line A-A of FIG. 12.

Here, an enlarged plan view of a carrier plate 24 is shown in FIG. 12. A sectional view of the carrier plate 24 taken on line A-A of FIG. 12 is shown in FIG. 13. As shown in FIGS. 12 and 13, the carrier plate 24: is a round plate that can slidably move along two bars 26; and has an outer carbon ring 27, support pins 28 extending from the carbon ring 27 toward the center of the carrier plate 24, and a guard ring 29 disposed on the support pins 28 inside the carbon ring 27. When a semiconductor wafer 30 is conveyed and heat-treated, the semiconductor wafer 30 is mounted on the support pins inside the guard ring 29. Here, the guard ring 29 plays the role of a wall to prevent the semiconductor wafer 30 from being misaligned and further prevent heat from escaping from the side of the semiconductor wafer 30 in order to heat the semiconductor wafer with a high degree of efficiency.

Figure 14:
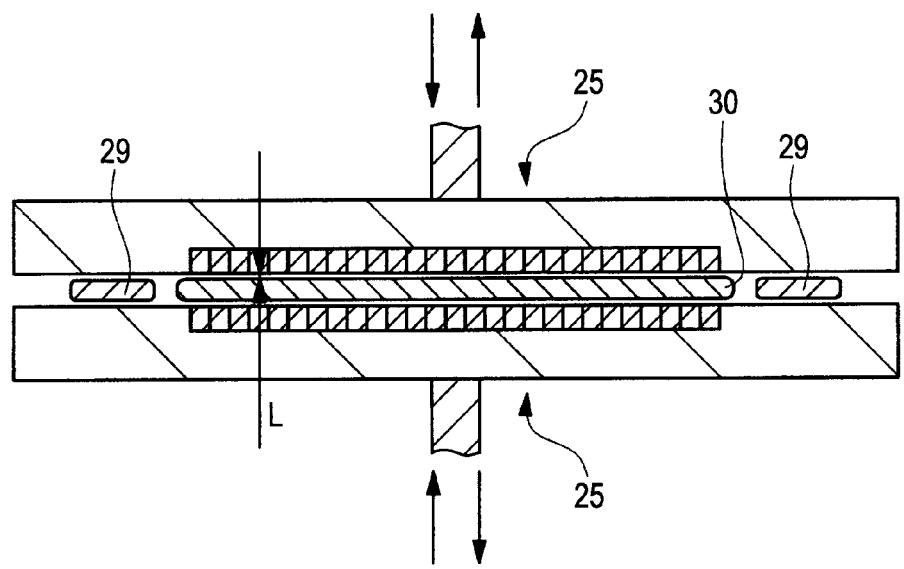
FIG. 14 is a sectional view showing a part of the thermal conductive annealing apparatus according to an embodiment of the present invention.

As shown in FIG. 14, a thermal conductive annealing apparatus 20 used in the present embodiment has carbon heaters (reactors 25) comprising two sheets of conductors that move vertically. On the occasion of heat treatment, in an $N_2$ (nitrogen) atmosphere, two reactors 25 are placed in the vicinities of the main surface and the back surface of a semiconductor wafer 30 by interposing the semiconductor wafer 30 retained in a noncontact manner with the carrier plate 24 (not shown in the figure) through a Bernoulli chuck (retained with a chuck) from the top and the bottom (from the main surface side and the back surface side of the semiconductor wafer 30) with the two sheets of reactors 25, the reactors 25 are heated by electric current, and thereby the semiconductor wafer 30 is heat-treated by the heating. That is, the two sheets of reactors 25 can move vertically to the main surface of the semiconductor wafer 30 mounted on the carrier plate 24 in the thermal conductive annealing apparatus 20 and the semiconductor wafer 30 is heat-treated by charging the semiconductor wafer 30 between the two sheets of reactors 25 and bringing the reactors 25 close to the main surface and the back surface of the semiconductor wafer 30 respectively.

In the thermal conductive annealing apparatus 20, since the reactors 25 move vertically and approach the main surface and the back surface of a semiconductor wafer 30 respectively, the distance L between the main surface of the semiconductor wafer 30 and the reactor 25 facing the main surface of the semiconductor wafer 30 shown in FIG. 14 can be reduced to about 150 μm and likewise the distance between the back surface of the semiconductor wafer 30 and the reactor 25 facing the back surface of the semiconductor wafer 30 can be reduced to about 150 μm too. By reducing the distances between the reactors 25 and the semiconductor wafer 30 without limit, the semiconductor wafer 30 can be heated at a high temperature-rise rate from the beginning of the heating of the semiconductor wafer 30 and the temperature of the semiconductor wafer 30 can reach a target temperature (here 280° C.) for a short period of time.

Further, since the semiconductor wafer 30 is mounted between and close to the two sheets of reactors 25, it is possible to regard the temperature of the reactors 25 as the temperature of the semiconductor wafer 30. Consequently, in the thermal conductive annealing apparatus 20, the temperature of the semiconductor wafer 30 itself is not measured and the temperature of the semiconductor wafer 30 is controlled on the premise that the temperature of the semiconductor wafer 30 is the same as the temperature of the reactors 25 computed from the value of current flowing in the reactors 25 and the like. Furthermore, since the thermal conductive annealing apparatus 20 is a sheet-type small annealing apparatus, it is possible to: retain the reactors 25 in the state of generating heat in the annealing apparatus; and extract and retract the semiconductor wafer 30 between the reactors 25 of a high temperature. Consequently, at the heat treatment, it is possible to: eliminate the time required for heating the reactors 25 to a temperature desired for heating the semiconductor wafer 30; and rapidly heat the semiconductor wafer 30 from the time when the semiconductor wafer 30 is charged between the reactors 25. In addition, by heat-treating the semiconductor wafer 30 by bringing the evenly heated reactors 25 close to the semiconductor wafer 30, it is possible to evenly heat the whole main surface and the whole back surface of the semiconductor wafer 30.

Since it is possible to heat the semiconductor wafer 30 at a closer range with movable carbon heaters as stated above and charge the semiconductor wafer 30 in the annealing apparatus already having reached a high temperature, in the sheet-type thermal conductive annealing apparatus 20 used for the first and second heat treatments in the present embodiment, it is possible to heat the semiconductor wafer 30 rapidly at a high temperature-rise rate. In the first heat treatment, it is possible to heat the semiconductor wafer 30 from room temperature (ordinary temperature) to 250° C. to 300° C. that is the target temperature of the annealing treatment for less than one second and hence the temperature-rise rate is not lower than 250° C./sec. to 300° C./sec. Likewise in the second heat treatment, it is possible to heat the semiconductor wafer 30 to 500° C. to 600° C. that is the target temperature of the annealing treatment for about one second and hence the temperature-rise rate is about 500° C./sec.

Meanwhile, the thermal conductive annealing apparatus 20 is characterized in that the temperature of the semiconductor wafer 30 does not overshoot when the semiconductor wafer 30 is heated. That is, in the case where the target temperature at the first heat treatment is 280° C. for example, it is possible to: start heating the semiconductor wafer 30; not raise the temperature of the semiconductor wafer 30 to a temperature higher than 280° C. after the temperature of the semiconductor wafer 30 reaches the target temperature of 280° C.; and apply soak annealing for a desired period of time at a constant temperature even after temperature of the semiconductor wafer 30 reaches 280° C. This is because the heating of the semiconductor wafer 30 starts in the state where the temperature of the reactors 25 to heat the semiconductor wafer 30 is kept at a temperature identical to the target temperature for heat-treating the semiconductor wafer, 30 beforehand and the temperature of the reactors 25 never rises to a temperature higher than the temperature during the heat treatment. Consequently, in the thermal conductive annealing apparatus 20, it is possible to: precisely control the temperature of the semiconductor wafer 30; prevent the crystal grain sizes of NiSi in a metal silicide layer 41 shown in FIG. 9 from increasing because there is no excess heating time; and form NiSi in the metal silicide layer 41 in the state of microcrystals about 20 nm to 30 nm in crystal grain size.

Figure 15:
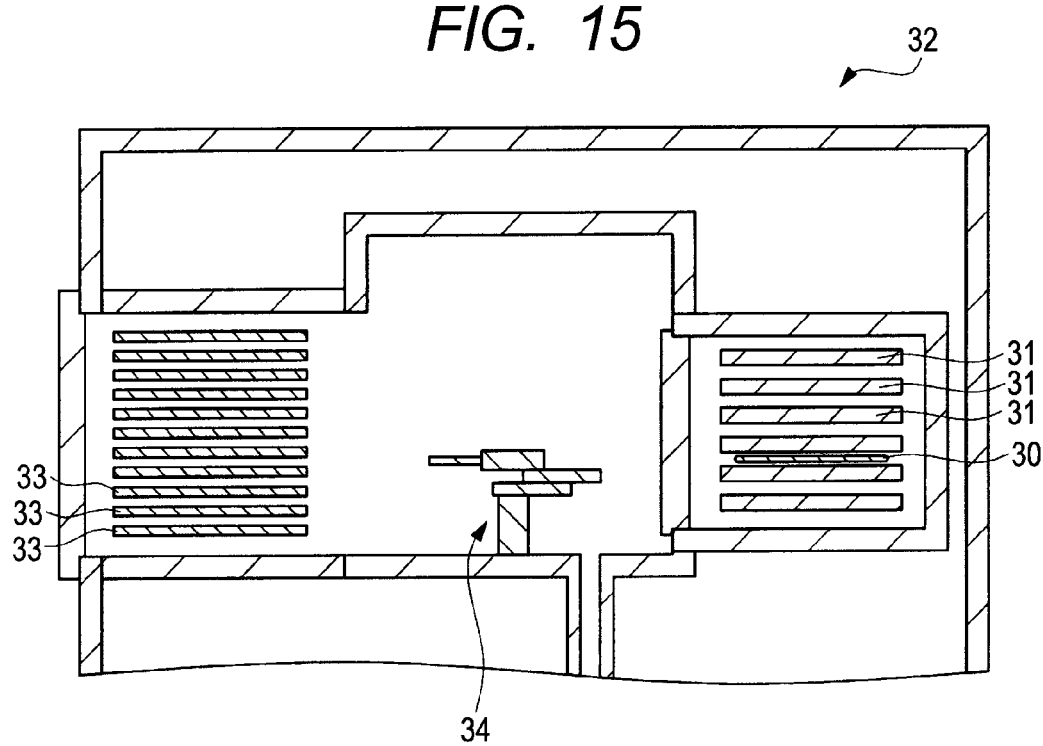
FIG. 15 is a sectional view showing the thermal conductive annealing apparatus.

Here, although a thermal conductive annealing apparatus 20 wherein a semiconductor wafer 30 is interposed between two sheets of movable reactors 25 and heat treatment is applied very close to the semiconductor wafer 30 is used in the present embodiment, it is also possible to use a thermal conductive annealing apparatus 32 that is a similar sheet-type thermal conductive annealing apparatus and has plural sheets of fixed heaters 31 fixed in the apparatus as shown in FIG. 15. FIG. 15 is a sectional view showing a thermal conductive annealing apparatus 32 and the thermal conductive annealing apparatus 32 is an annealing apparatus having plural sheets of cooling plates 33, a robot arm 34, and fixed heaters 31 in the apparatus. Here, the interior of the thermal conductive annealing apparatus 32 is maintained in an $N_2$ atmosphere with a chamber (not shown in the figure).

At heat treatment, a semiconductor wafer 30 is: firstly inserted and charged between cooling plates 33 from the exterior of the thermal conductive annealing apparatus 32; thereafter charged between fixed heaters 31 with a robot arm 34; and heat-treated with the fixed heaters 31. Thereafter, the semiconductor wafer 30 is: transferred from between the fixed heaters 31 to between the cooling plates 33 with the robot arm 34; cooled with the cooling plates; and then extracted from above the cooling plates to the exterior of the thermal conductive annealing apparatus 32.

In the thermal conductive annealing apparatus 32, the fixed heaters 31 themselves do not move and a semiconductor wafer 30 is moved, inserted between plural fixed heaters 31, heat-treated, and thereafter extracted, and hence it is impossible to bring the heaters as close to the semiconductor wafer 30 as the heaters of the thermal conductive annealing apparatus 20 explained in reference to FIGS. 11 to 14. Since the thermal conductive annealing apparatus 32 shown in FIG. 15 has a sheet-type small annealing furnace however, it is possible to extract and retract the semiconductor wafer 30 in the state of heating the fixed heaters 31 and heat the semiconductor wafer 30 rapidly at a high temperature-rise rate, and hence the thermal conductive annealing apparatus 32 shown in FIG. 15 may be used for the first and second heat treatments. Here, the fixed heaters 31 shown in FIG. 15 are heaters that are made of aluminum for example and generate heat by resistive heating (Joule heat).

Figure 16:
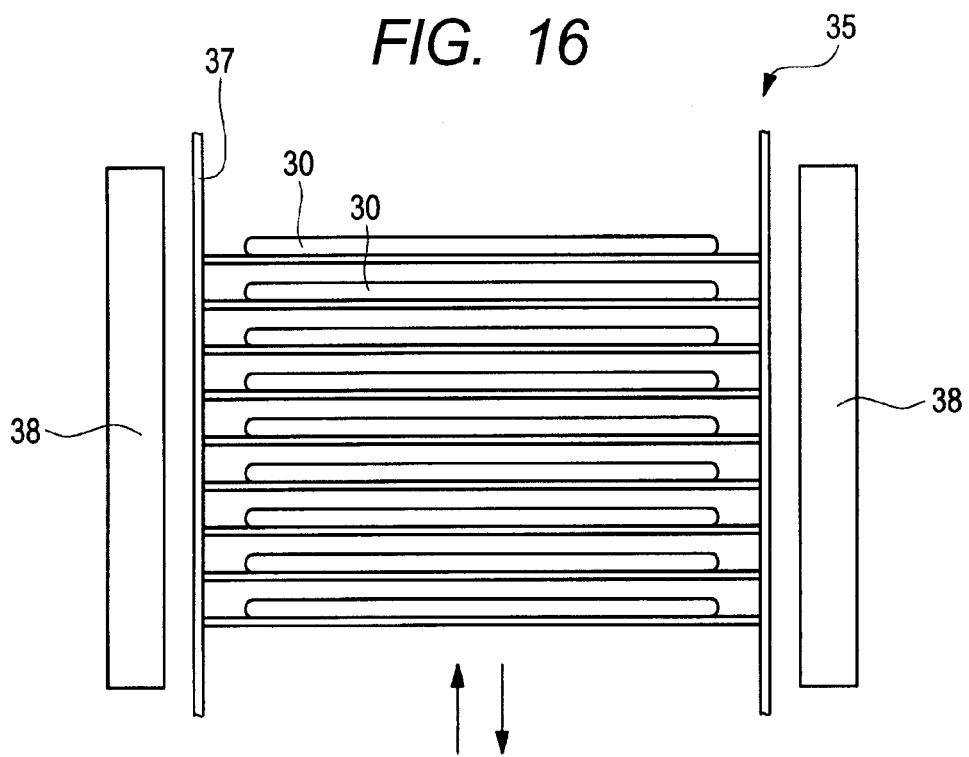
FIG. 16 is a sectional view showing a batch-type annealing apparatus as a comparative example.
Figure 17:
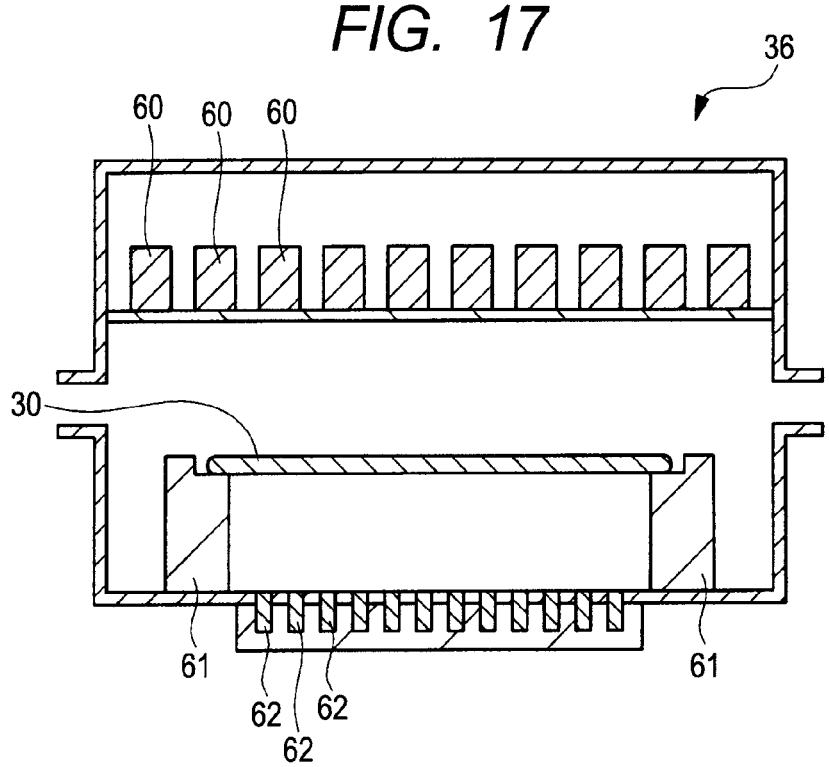
FIG. 17 is a sectional view showing a lamp-type annealing apparatus as a comparative example.

In contrast, a batch-type annealing apparatus 35 shown in FIG. 16 as a comparative example and a lamp-type annealing apparatus 36 shown in FIG. 17 as another comparative example are not applied to the first and second heat treatments in the present embodiment.

A batch-type annealing apparatus 35 shown in FIG. 16 is a batch-type thermal conductive annealing apparatus wherein a rack 37 on which plural semiconductor wafers 30 are mounted is inserted between plural fixed heaters 38 generating heat by resistive heating from below the fixed heaters 38 and the plural semiconductor wafers 30 are heated. Since the batch-type annealing apparatus 35 is an apparatus having a large annealing furnace however, it is impossible to extract and retract the rack 37 on which the semiconductor wafers 30 are mounted from the batch-type annealing apparatus 35 in the state where the fixed heaters 38 maintain a high temperature. Consequently, since the rack 37 on which the semiconductor wafers 30 are mounted is inserted between the fixed heaters 38 and thereafter the temperature of the fixed heaters 38 is raised, it takes a long period of time for the temperature of the fixed heaters 38 to rise and the semiconductor wafers 30 has to be heated for a long period of time at temperatures that are lower than a target temperature and hardly controllable before the semiconductor wafers 30 starts being heated at a desired temperature.

Meanwhile, in a lamp-type annealing apparatus 36 shown in FIG. 17, similarly to the batch-type annealing apparatus 35 stated above, a problem is that it takes time for the temperature of a semiconductor wafer 30 to rise to a desired temperature necessary for heat treatment. The problem is caused by the fact that, in the case of the lamp-type annealing apparatus 36, the temperature of a semiconductor wafer 30 is measured with radiation thermometers 62 and the temperature of lamps (heaters) 60 cannot be kept at a high temperature when a semiconductor wafer 30 is charged in the lamp-type annealing apparatus.

As shown in FIG. 17, the lamp-type annealing apparatus 36 has: a wafer table 61 at the bottom in the apparatus; plural lamps (tungsten halogen lamps) 60 to heat a semiconductor wafer 30 above the semiconductor wafer 30 on the main surface side of the semiconductor wafer 30 in the apparatus; and plural radiation thermometers 62 to measure the temperature of the semiconductor wafer 30 at the lower part of the wafer table 61 at the bottom in the apparatus. Here, in the lamp-type annealing apparatus 36, no device to heat a semiconductor wafer 30 is disposed below the semiconductor wafer 30 on the back surface side of the semiconductor wafer 30. As a type of the lamps in the lamp-type annealing apparatus 36 for example, a halogen lamp type or a flashlamp type is named.

Figure 18A:
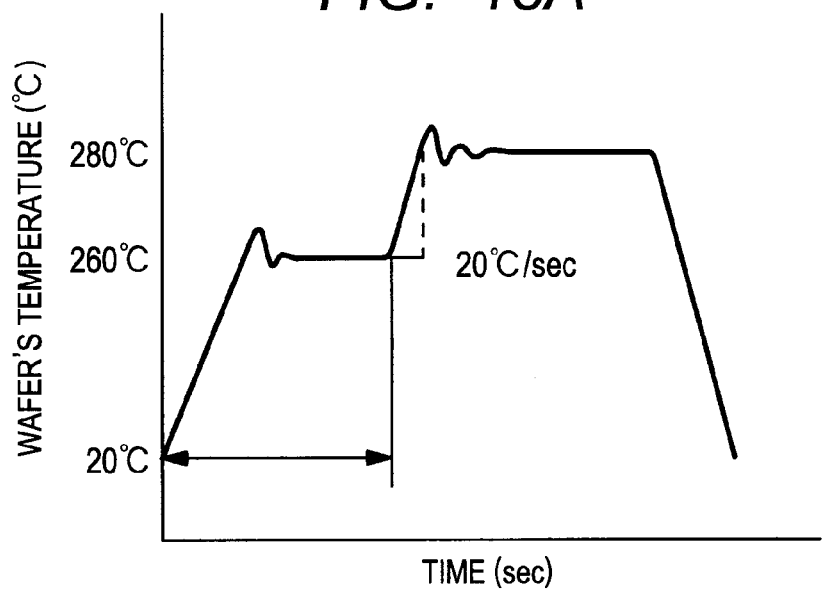
FIG. 18($a$) is a graph showing a relationship between a temperature of a semiconductor wafer and a time in a heat treatment with a lamp-type annealing apparatus as a comparative example.

Here, a graph showing a relationship between a temperature of a semiconductor wafer 30 and a time when the semiconductor wafer 30 is heated with the lamp-type annealing apparatus 36 in the first heat treatment of the present embodiment is shown in FIG. 18(a). Since it is necessary to apply heat treatment for about 30 sec. at 250° C. to 300° C. in order to form a metal silicide layer 41 in the first heat treatment, the temperature of a semiconductor wafer 30 is kept at about 280° C. and soak-annealing is applied for 30 sec. in the graph shown in FIG. 18(a).

As shown in FIG. 17, radiation thermometers 62 are used for measuring the temperature of a semiconductor wafer 30 in the lamp-type annealing apparatus 36 and generally the temperature of the semiconductor wafer 30 is measured by detecting infrared rays reflected on the surface of the semiconductor wafer 30. However, the frequency of infrared rays comes to be the frequency at which the infrared rays permeate the semiconductor wafer 30 when the temperature of a semiconductor wafer 30 is 250° C. or lower, and hence the radiation thermometers 62 cannot detect the temperature of the semiconductor wafer 30 until the temperature of the semiconductor wafer 30 rises from ordinary temperature to about 260° C. Consequently, as shown in the graph of FIG. 18(a), in the case of the lamp-type annealing apparatus 36, it is necessary to apply soak annealing for 30 to 60 sec. at about 260° C. in order to once keep the temperature of the semiconductor wafer 30 constant at about 260° C. at which the temperature of the semiconductor wafer 30 can be measured. Thereafter, the semiconductor wafer 30 is heated to 280° C. that is the temperature necessary at the first heat treatment. The temperature-rise rate is high in the lamp-type annealing apparatus 36 after soak annealing is applied at about 260° C., it takes less than one second for the semiconductor wafer 30 of 260° C. to be heated to 280° C., and hence the temperature-rise rate is set at about 20° C./sec.

Further, as shown in the graph of FIG. 18(a), when a semiconductor wafer 30 is heat-treated with the lamp-type annealing apparatus 36, the phenomenon of the temperature of the semiconductor wafer 30 reaching 280° C. that is a target temperature and thereafter reaching a temperature higher than 280° C. (overshoot) occurs. This is because, in the lamp-type annealing apparatus 36, the temperature of the semiconductor wafer 30 comes close to the target temperature by measuring the temperature of the semiconductor wafer 30 with the radiation thermometers 62 and stopping the heating by the lamps 60 when the temperature of the semiconductor wafer 30 reaches the target temperature. On this occasion, even if the heating by the lamps 60 is stopped when the temperature of the semiconductor wafer 30 reaches the target temperature, the rise of the temperature of the semiconductor wafer 30 does not stop soon and hence overshoot occurs. Further, in the lamp-type annealing apparatus 36, the soak annealing is applied while the temperature of the semiconductor is maintained in the vicinity of the target temperature by waiting until the temperature of the semiconductor wafer 30 drops after the temperature of the semiconductor wafer 30 overshoots and starting to heat the semiconductor wafer 30 by making the lamps 60 generate heat when the temperature of the semiconductor wafer 30 drops up to the target temperature. In this way, after the temperature of the semiconductor wafer 30 firstly reaches the target temperature, the temperature of the semiconductor wafer 30 rises and drops repeatedly from the target temperature for a certain period of time and cannot be maintained at a constant temperature and hence it is impossible to heat-treat the semiconductor wafer 30 with a high degree of accuracy with the lamp-type annealing apparatus 36.

In this way, with an annealing apparatus that causes overshoot, it is impossible to control a heating temperature with a high degree of accuracy when a semiconductor wafer 30 is heat-treated. This is applied to not only the lamp-type annealing apparatus 36 stated above but also a laser-type annealing apparatus to heat-treat a semiconductor wafer 30 by laser and, with a laser-type annealing apparatus too, it is impossible to heat-treat a semiconductor wafer 30 with a high degree of accuracy. This is because the laser-type annealing apparatus is the same as the lamp-type annealing apparatus 36 on the point that the temperature of a semiconductor wafer 30 is measured with a radiation thermometer and the temperature is adjusted on the basis of the measured value during heating process. In a thermal conductive annealing apparatus 20 used in the present embodiment, the apparatus is held in the state where two sheets of reactors 25 are heated to a target temperature at which heat treatment is applied beforehand and in the meantime a semiconductor wafer 30 is inserted. That is, since the temperature of the heaters to heat the semiconductor device reaches a target temperature for heat-treating the semiconductor device already when a semiconductor substrate is charged into the device, it is possible to heat-treat a semiconductor wafer 30 at a high temperature-rise rate without raising the temperature of the semiconductor wafer 30 to a temperature higher than the temperature of the reactors 25 and thus without causing overshoot.

For example, when the first heat treatment is applied with a lamp-type annealing apparatus 36 that is a comparative example, a metal silicide layer 41 is formed by applying soak annealing for 30 sec. while the temperature of a semiconductor wafer 30 is kept at 280° C. after the semiconductor wafer 30 is heated to 280° C. through a heating process. As state above however, when a lamp-type annealing apparatus 36 is used, it takes a long time for the temperature of a semiconductor wafer 30 to reach a desired heat treatment temperature (here 280° C.) from ordinary temperature. Moreover, the time zone during which the temperature of a semiconductor wafer 30 is 250° C. or lower and the time zone up to the finish of the soak annealing to keep the temperature of the semiconductor wafer 30 constant at 260° C. are the time zones during which the temperature of the semiconductor wafer 30 cannot be controlled (uncontrollable zones).

Further, in a lamp-type annealing apparatus 36, since it is difficult to evenly heat the surface of a semiconductor wafer 30, on the occasion of heat treatment, heat treatment is applied while the semiconductor wafer 30 is rotated around the axis perpendicular to and in the center of the main surface of the semiconductor wafer 30 having a nearly round shape. The purpose is to evenly heat the whole plane of the semiconductor wafer 30 and, in the lamp-type annealing apparatus 36 therefore, the semiconductor wafer 30 is not fixed with a Bernoulli chuck or a vacuum chuck or by a mechanically holding means in order to rotate the semiconductor wafer 30.

As stated above, in a lamp-type annealing apparatus 36, a relatively long period of time is required until the temperature of a semiconductor wafer 30 reaches a target temperature. If it is attempted to further raise a temperature-rise rate and heat a semiconductor wafer 30 rapidly for a short period of time with the aim of shortening the time, there is the possibility that the rotating semiconductor wafer 30 vibrates because rapid heating causes the surface temperature of the semiconductor wafer 30 to be uneven, and the semiconductor wafer is likely to bounce, and fall off from a wafer table 61. On this occasion, the surface of the semiconductor wafer 30 is damaged and a uniform heat treatment to the whole plane of the semiconductor wafer 30 cannot be obtained.

As stated above, the problem of a lamp-type annealing apparatus 36 is that a semiconductor wafer 30 bounces when the semiconductor wafer 30 is heated at a high temperature-rise rate. Further, in the lamp-type annealing apparatus 36, since the temperature of a semiconductor wafer 30 overshoots while the semiconductor wafer 30 is heated, if the semiconductor wafer 30 is heated at a high temperature-rise rate, a further large overshoot occurs and it is impossible to heat-treat the semiconductor wafer 30 with a high degree of accuracy.

Meanwhile, in the first heat treatment, a metal film 12 reacts with a semiconductor substrate 1 at a temperature of 200° C. or higher and a metal silicide layer 41 is formed. When the first heat treatment is applied with a lamp-type annealing apparatus 36 however, the metal silicide layer 41 is formed also in an uncontrollable region where the temperature of a semiconductor wafer 30 is 200° C. or higher and thereafter it takes a long period of time until the temperature of the semiconductor wafer 30 reaches a target temperature.

From the above situation, with a lamp-type annealing apparatus 36, it is impossible to heat a semiconductor wafer 30 rapidly without causing overshoot unlike with a thermal conductive annealing apparatus 20 and a long heating time is required for heat treatment, and hence a thermal budget (heat history) increases and the crystal grain sizes of NiSi in a metal silicide layer 41 formed at the first heat treatment increase. More specifically, when the first heat treatment is applied with a thermal conductive annealing apparatus 20, microcrystals of NiSi about 20 nm to 30 nm in average crystal grain size are formed in a metal silicide layer 41 formed through the first heat treatment but, when the first heat treatment is applied with a lamp-type annealing apparatus 36, the crystal grain sizes of NiSi in a formed silicide layer increase to about several microns. Further, when a heat treatment is applied with a lamp-type annealing apparatus 36, crystals in a silicide layer tend to grow large and a resultant problem is that the silicide layer is likely to grow abnormally in a channel of a semiconductor substrate 1.

In contrast, in a thermal conductive annealing apparatus 20 used at the first and second heat treatments of the present embodiment that is explained in reference to FIGS. 11 to 14, not the temperature of a semiconductor wafer 30 is adjusted by measuring the temperature of the semiconductor wafer 30 and raising or lowering the temperature of reactors 25 when the temperature of the semiconductor wafer 30 reaches a target temperature but the heating of a semiconductor wafer 30 starts in the state where the temperature of reactors 25 is raised to a temperature identical to a target temperature necessary for the heat treatment of the semiconductor wafer 30 beforehand. As a result, as stated above, the temperature of a semiconductor wafer 30 never rises to a temperature higher than the temperature of reactors 25 and overshoot never happens.

Further, in a thermal conductive annealing apparatus 20, the temperature of a semiconductor wafer 30 is not measured, the temperature of carbon heaters configuring reactors 25 is computed from the value of electric current flowing in the carbon heaters and the like and set so as to maintain the target temperature of a heat treatment. Consequently, as stated above, the temperature of a semiconductor wafer 30 can be regarded as the temperature of the reactors 25 of the thermal conductive annealing apparatus 20 and hence, in the first and second heat treatments of the present embodiment wherein a thermal conductive annealing apparatus 20 is used, an uncontrollable region where the temperature of a semiconductor wafer 30 cannot be controlled does not exist.

Figure 18B:
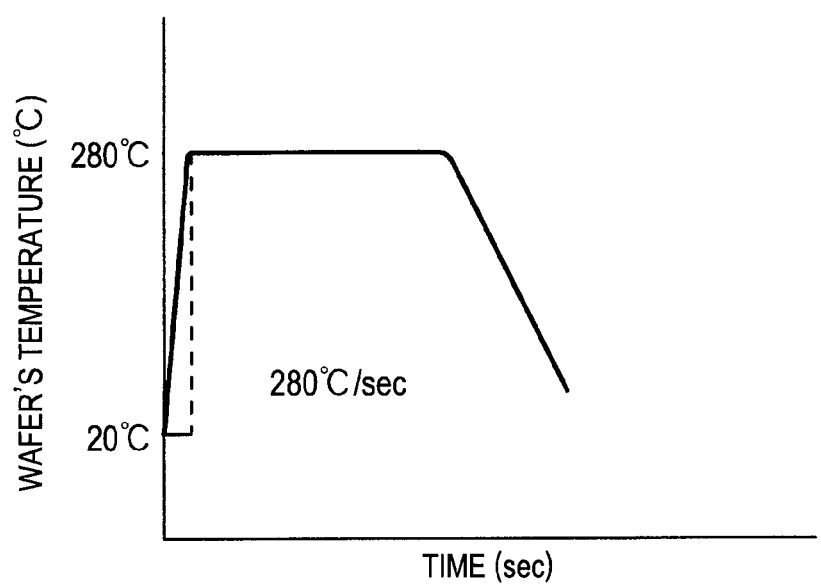

Here, a graph showing a relationship between a temperature of a semiconductor wafer 30 and a time when the semiconductor wafer 30 is heat-treated with a thermal conductive annealing apparatus 20 used at the first heat treatment of the present embodiment is shown in FIG. 18(b). As shown in FIG. 18(b), the temperature-rise rate when a semiconductor wafer 30 is heat-treated with a thermal conductive annealing apparatus 20 is about 250° C./sec. to 300° C./sec. and the temperature of the semiconductor wafer 30 reaches a target temperature (about 280° C.) for a short period of time.

In this way, in heat treatment, by heating a semiconductor wafer 30 to a target temperature for a short period of time and shortening heating time other than soak annealing time, it is possible to reduce a thermal budget (heat history) and reduce the crystal grain sizes of NiSi in a formed metal silicide layer 41.

Like the present embodiment stated above, when a low-resistivity metal silicide layer 41 of 15 nm or less is formed while abnormal growth of the metal silicide layer 41 is prevented, it is very advantageous to use a thermal conductive annealing apparatus 20 at the first and second heat treatments or to use a salicide process of a partial reaction type.

In this way, in the present embodiment, a metal silicide layer 41 comprising NiSi and Pt is formed over the surfaces (upper parts) of a gate electrode 8a and a source/drain region ($n^+$-type semiconductor regions 9b) of an n-channel MISFETQn and the surfaces (upper parts) of a gate electrode 8b and a source/drain region ($p^+$-type semiconductor regions 10b) of a p-channel MISFETQp by applying first and second heat treatments with a thermal conductive annealing apparatus 20. Then, although it depends on the thickness of a metal film 12 reacting with a semiconductor substrate 1, when the thickness of a reacting metal film 12 is about 8 nm for example, the thickness of a metal silicide layer 41 formed after the reaction is about 15 nm for example.

Figure 19:
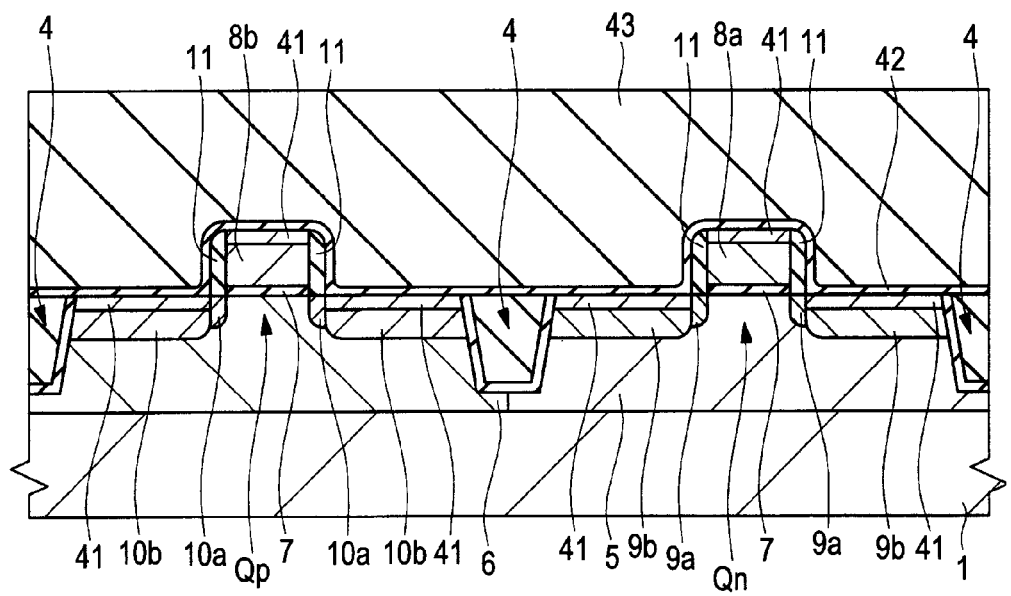
FIG. 19 is a sectional view showing the substantial part of the semiconductor device in a manufacturing process following the manufacturing process shown in FIG. 10.

Successively, as shown in FIG. 19, an insulation film 42 is formed over the main surface of the semiconductor substrate 1. That is, an insulation film 42 is formed over the semiconductor substrate 1 including over the metal silicide layer 41 so as to cover the gate electrodes 8a and 8b. The insulation film 42 comprises a silicon nitride film for example and can be formed by a plasma CVD method of a film forming temperature (substrate temperature) of about 450° C. or the like. Thereafter, an insulation film 43 having a thickness thicker than that of the insulation film 42 is formed over the insulation film 42. The insulation film 43 comprises a silicon oxide film for example and can be formed with TEOS by a plasma CVD method of a film forming temperature of about 450° C. or the like. Thereby, an interlayer insulation film comprising the insulation films 42 and 43 is formed. Thereafter, the upper plane of the insulation film 43 is flattened by polishing the surface of the insulation film 43 by a CMP method or the like. Even though a concavo-convex shape is formed over the surface of the insulation film 42 due to the level unevenness of the lower layers, it is possible to obtain an interlayer insulation film the surface of which is planarized by polishing the surface of the insulation film 43 by a CMP method.

Figure 20:
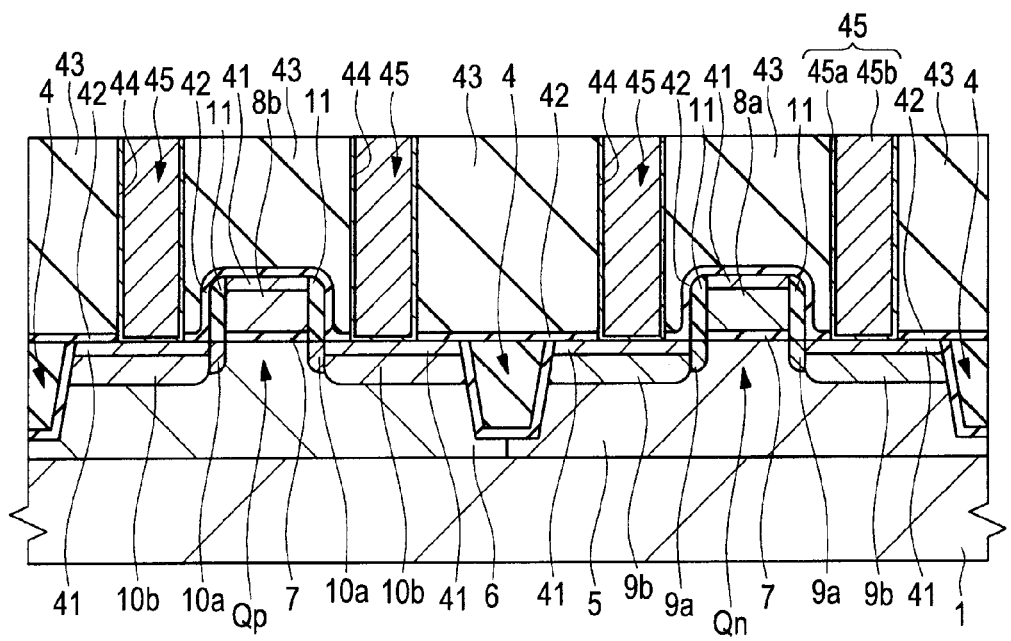
FIG. 20 is a sectional view showing the substantial part of the semiconductor device in a manufacturing process following the manufacturing process shown in FIG. 19.

Successively, as shown in FIG. 20, contact holes (through-holes, holes) 44 are formed in the insulation films 42 and 43 by using a photoresist pattern (not shown in the figure) formed over the insulation film 43 as an etching mask and dry-etching the insulation films 42 and 43. On this occasion, firstly contact holes 44 are formed in the insulation film 43 by dry-etching the insulation film 43 under the condition under which the insulation film 43 is more likely to be etched than the insulation film 42 and using the insulation film 42 as an etching stopper film, and then the insulation film 42 at the bottoms of the contact holes 44 is dry-etched and removed under the condition under which the insulation film 42 is more likely to be etched than the insulation film 43. At the bottoms of the contact holes 44, parts of the main surface of the semiconductor substrate 1, for example parts of the metal silicide layer 41 over the surfaces of the n$^+$-type semiconductor regions 9b and the p$^+$-type semiconductor regions 10b and parts of the metal silicide layer 41 over the surfaces of the gate electrodes 8a and 8b, are exposed.

Successively, plugs (connecting conductors, embedded plugs, or embedded conductors) 45 made of tungsten (W) or the like are formed in the contact holes 44. The plugs 45 are formed for example by forming a barrier conductor film 45a (for example, a titanium film, a titanium nitride film, or a laminated film of those films) is formed over the insulation film 43 containing the interiors (bottoms and sidewalls) of the contact holes 44 by a plasma CVD method of a film forming temperature (substrate temperature) of about 450° C. Then a main conductor film 45b comprising a tungsten film and the like is formed over the barrier conductor film 45a so as to fill the contact holes 44 by a CVD method or the like, unnecessary main conductor film 45b and barrier conductor film 45a over the insulation film 43 are removed by a CMP method, an etch back method, or the like, and thereby plugs 45 are formed. The plugs 45 formed over the gate electrodes 8a and 8b, the n$^+$-type semiconductor regions 9b, and the p$^+$-type semiconductor regions 10b touch and are electrically coupled to the metal silicide layer 41 over the surfaces of the gate electrodes 8a and 8b, the n$^+$-type semiconductor regions 9b, and the p$^+$-type semiconductor regions 10b at the bottoms.

Figure 21:
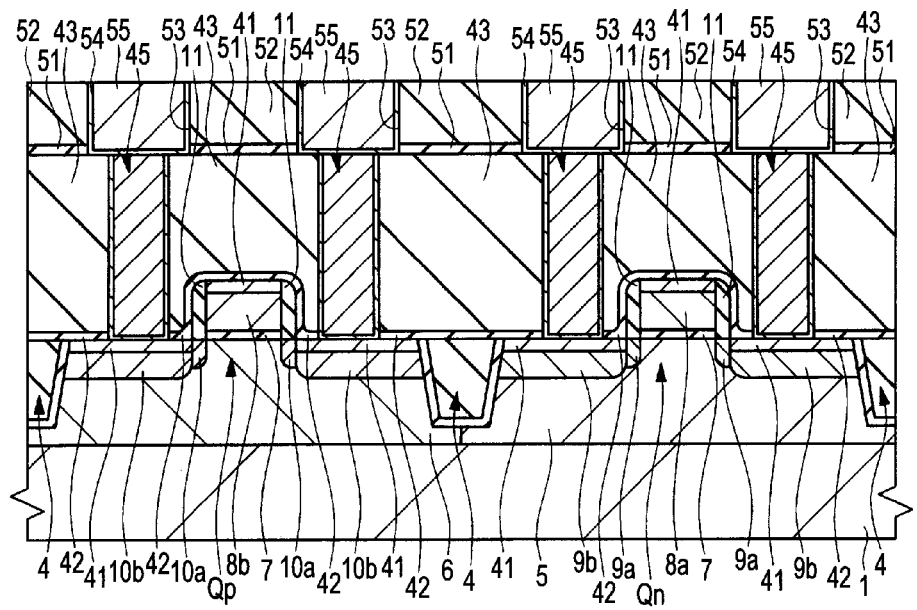
FIG. 21 is a sectional view showing the substantial part of the semiconductor device in a manufacturing process following the manufacturing process shown in FIG. 20.

Successively, as shown in FIG. 21, a stopper insulation film 51 and an insulation film 52 for wire forming are formed in sequence over the insulation film 43 into which the plugs 45 are embedded. The stopper insulation film 51 is a film acting as an etching stopper when groove working is applied to the insulation film 52 and a material having an etching selectivity to the insulation film 52 is used. A silicon nitride film formed by a plasma CVD method for example may be used for the stopper insulation film 51 and a silicon oxide film formed by a plasma CVD method for example may be used for the insulation film 52. Here, wiring of a first layer that is explained below is formed over the stopper insulation film 51 and the insulation film 52.

Successively, wiring of a first layer is formed by a single damascene method. Firstly, wiring grooves 53 are formed in predetermined regions of the insulation film 52 and the stopper insulation film 51 by dry etching using a resist pattern (not shown in the figure) as a mask, and thereafter a barrier conductor film (barrier metal film) 54 is formed over the main surface (namely over the insulation film 52 including over the bottoms and sidewalls of the wiring grooves) of the semiconductor substrate 1. As the barrier conductor film 54, a titanium nitride film, a tantalum film, or a tantalum nitride film may be used for example. Successively, a copper seed layer is formed over the barrier conductor film 54 by a CVD method, a sputtering method, or the like and further a copper plated film is formed over the seed layer by an electrolytic plating method or the like. The interiors of the wiring grooves 53 are filled with the copper plated film. Thereafter, a wiring 55 of a first layer comprising copper as the main conductive material is formed by removing the copper plated film, the seed layer, and the barrier conductor film 54 in the regions other than the region of the wiring grooves 53 by a CMP method. The wiring 55 is electrically coupled to the n$^+$-type semiconductor regions 9b and the p$^+$-type semiconductor regions 10b for the sources and the drains of the n-channel MISFETQn and the p-channel MISFETQp, the gate electrodes 8a and 8b, and the like through the plugs 45. Thereafter, wiring of a second layer is formed by a dual damascene method but the figures and the explanations thereof are omitted here. In this way, a semiconductor device according to the present embodiment is completed.

Figure 22:
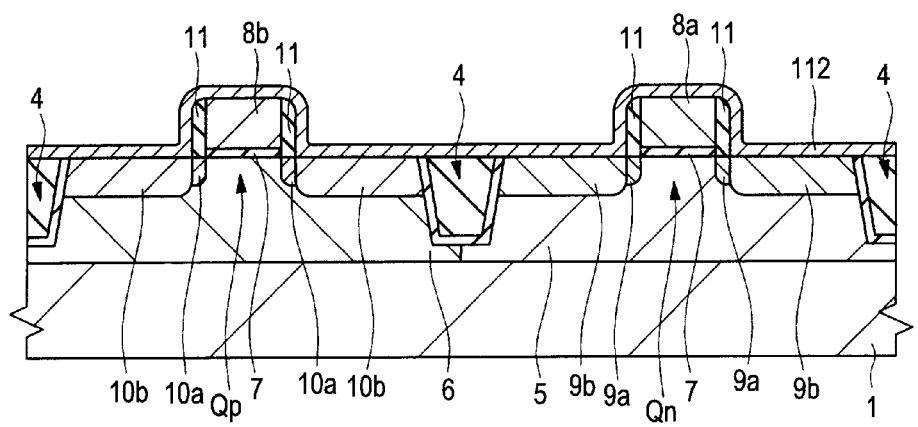
FIG. 22 is a sectional view showing a substantial part of a semiconductor device in a manufacturing process as a comparative example.
Figure 23:
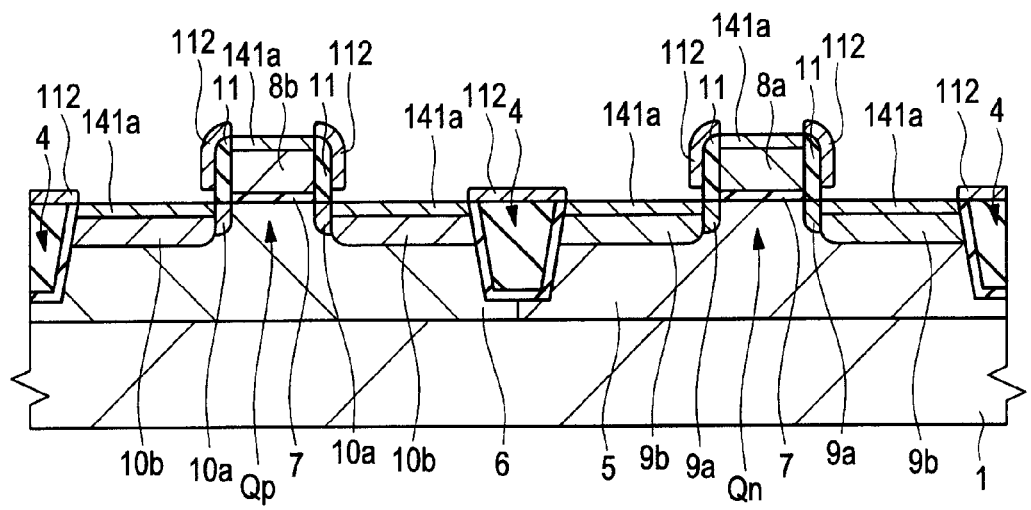
FIG. 23 is a sectional view showing the substantial part of the semiconductor device in a manufacturing process following the manufacturing process shown in FIG. 22.
Figure 24:
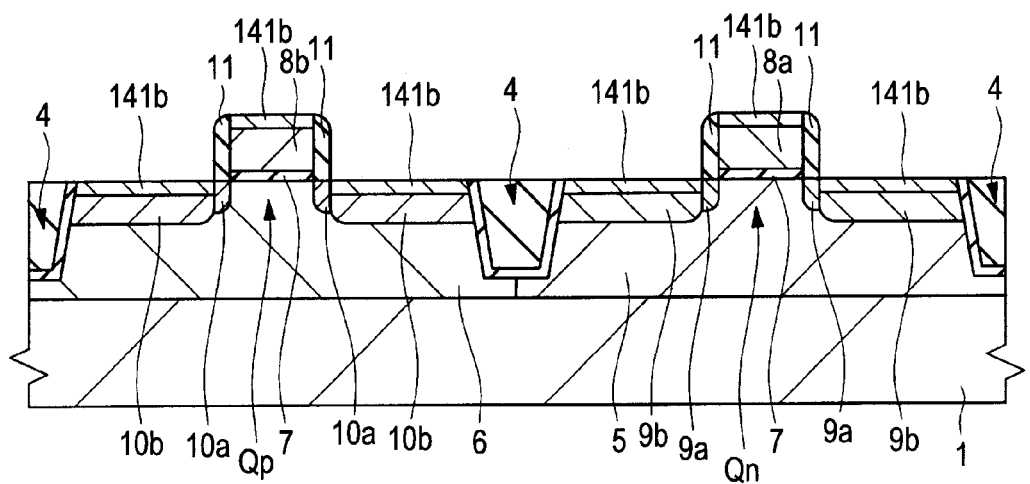
FIG. 24 is a sectional view showing the substantial part of the semiconductor device in a manufacturing process following the manufacturing process shown in FIG. 23.
Figure 25:
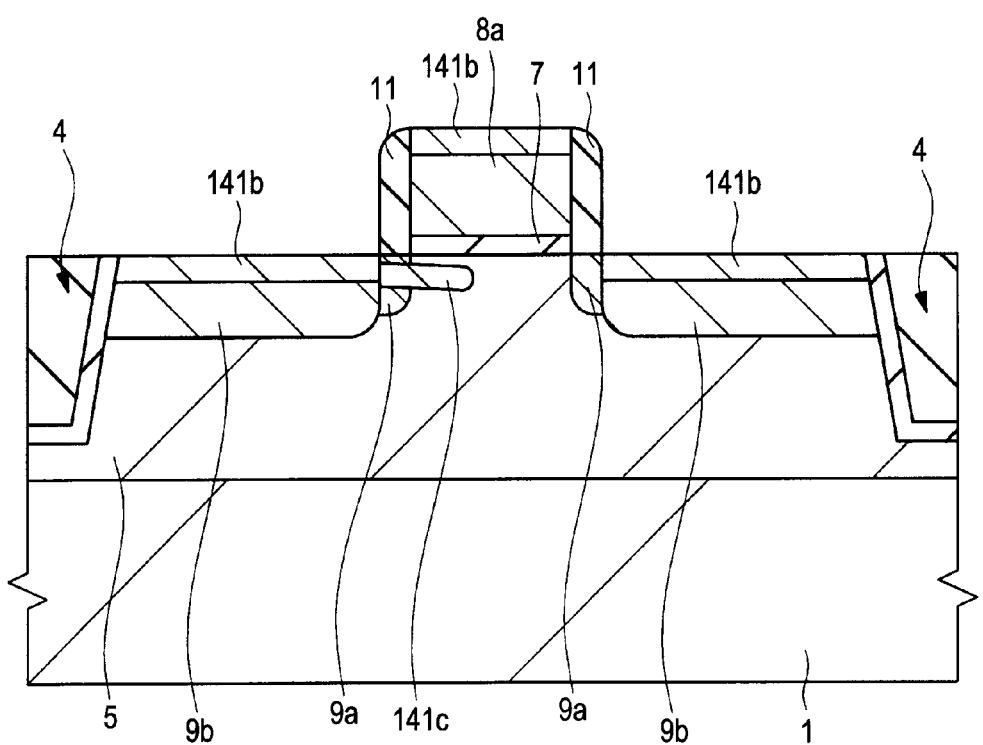
FIG. 25 is an enlarged sectional view showing a substantial part of a semiconductor device as a comparative example.

Successively, the effect of the present embodiment is explained more specifically. FIGS. 22 to 24 are sectional views showing a substantial part of a semiconductor device in manufacturing processes shown as a comparative example. FIG. 25: is a sectional view showing a substantial part of the semiconductor device in a manufacturing process in the comparative example; and shows the region where an n-channel MISFET is formed in the process step corresponding to FIG. 24.

A semiconductor device shown in FIGS. 22 to 25 as a comparative example is manufactured in the same way as a semiconductor device according to the present embodiment, except that an Ni$_2$Si layer 141a and an NiSi layer 141b corresponding to a metal silicide layer 41 in the present embodiment are formed with a lamp-type annealing apparatus 36 through a salicide process of a whole reaction type unlike the present embodiment.

In the manufacturing of a semiconductor device according to the comparative example, after a structure corresponding to FIG. 7 of the present embodiment is obtained, as shown in FIG. 22, an Ni film 112 (a substance corresponding to a metal film 12 in the present embodiment) is deposited over the main surface of a semiconductor substrate 1 including gate electrodes 8a and 8b, n$^+$-type semiconductor regions 9b, and p$^+$-type semiconductor regions 10b. Here, when a metal silicide layer having a thickness similar to a metal silicide layer 41 in the present embodiment is formed over the surface of the semiconductor substrate 1 in the comparative example, the Ni film 112 is formed so that the film thickness may be thinner than the thickness of the metal film 12 shown in FIG. 8. This is because, when a salicide process of a whole reaction type is used, the thickness of a metal silicide layer formed after heat treatment is decided by the thickness of an Ni film 112 formed before the heat treatment and, if a thick film like the metal film 12 formed through a salicide process of a partial reaction type stated above is formed and heat treatment is applied in the salicide process of a whole reaction type, an unnecessarily thick metal silicide layer is formed undesirably.

Thereafter, by applying a first step heat treatment for about 30 sec. at a temperature of 350° C. or lower (here, at about 280° C.) by an RTA method in a lamp-type annealing apparatus 36 shown in FIG. 17, as shown in FIG. 23, the gate electrodes 8a and 8b, the n$^+$-type semiconductor regions 9b, and the p$^+$-type semiconductor regions 10b (silicon configuring those) selectively react with the Ni film 112, and an Ni$_2$Si layer 141a is formed over the surfaces of the gate electrodes 8a and 8b, the n$^+$-type semiconductor regions 9b, and the p$^+$-type semiconductor regions 10b. Here, the first step heat treatment is a process corresponding to the first heat treatment in the present embodiment.

Here, since the salicide process of a whole reaction type is used in the comparative example, the Ni film 112 formed over the gate electrodes 8a and 8b, the n$^+$-type semiconductor regions 9b, and the p$^+$-type semiconductor regions 10b reacts with all of the gate electrodes 8a and 8b, the n$^+$-type semiconductor regions 9b, and the p$^+$-type semiconductor regions 10b through the first step heat treatment, and an unreacted Ni film 112 remains over the surfaces of the sidewalls 11 and element isolation region 4. That is: the Ni film 112 remains in the regions other than the regions over the gate electrodes 8a and 8b, the n$^+$-type semiconductor regions 9b, and the p$^+$-type semiconductor regions 10b; the Ni film 112 formed over the gate electrodes 8a and 8b, the n+-type semiconductor regions 9b, and the p+-type semiconductor regions 10b reacts with the gate electrodes 8a and 8b, the n+-type semiconductor regions 9b, and the p+-type semiconductor regions 10b; and thus the Ni$_2$Si layer 141a is formed. The Ni$_2$Si layer 141a is a metal-rich phase mainly containing Ni$_2$Si and Ni$_3$Si but crystals of NiSi having crystal grain sizes of about several microns are also formed.

Successively, as shown in FIG. 24, after the unreacted Ni film 112 is removed by applying wet cleaning, a second step heat treatment is applied for about 30 sec. at 300° C. to 650° C. by an RTA method with a lamp-type annealing apparatus 36 shown in FIG. 17. By so doing, the Ni$_2$Si layer 141a further reacts with silicon (Si) in the gate electrodes 8a and 8b, the n+-type semiconductor regions 9b, and the p+-type semiconductor regions 10b through the second step heat treatment (by the reaction of Ni$_2$Si+Si→2NiSi) and an NiSi layer 141b comprising NiSi that is more stable than Ni$_2$Si and has a low resistivity is formed over the surfaces of the gate electrodes 8a and 8b, the n+-type semiconductor regions 9b, and the p+-type semiconductor regions 10b. Here, the second step heat treatment stated above is a process corresponding to the second heat treatment in the present embodiment. Further, NiSi formed by the reaction through the heat treatment stated above turns to NiSi$_2$ when it is further heated.

In this way, in the comparative example, a layer containing mainly Ni$_2$Si and NiSi of large crystal grain sizes (the Ni$_2$Si layer 141a) is formed through the first step heat treatment and the Ni$_2$Si is changed to a layer comprising NiSi (the NiSi layer 141b) through the succeeding second step heat treatment. Thereafter, in a semiconductor device according to the comparative example too, in the same way as the present embodiment, insulation films 42 and 43, contact holes 44, plugs 45, a stopper insulation film 51, an insulation film 52, and a wiring 55 are formed but the figures and the explanations thereof are omitted here. Through the above processes, a semiconductor device according to the comparative example is manufactured.

In the salicide process of a whole reaction type shown in the comparative example, the thickness of an NiSi layer 141b is controlled by the thickness of an Ni film 112 formed over a semiconductor substrate 1 but, by the method, the accuracy of the thickness of the Ni film 112 tends to influence the variation of the thickness of the NiSi layer 141b. In the present embodiment in contrast, since a thermal conductive annealing apparatus 20 capable of controlling a temperature and a heating time in a heat treatment with a high degree of accuracy is used and also a salicide process of a partial reaction type to control the thickness of a metal silicide layer 41 by the time and the temperature in the heat treatment is used, it is possible to form a metal silicide layer 41 having a thickness of no variance and good accuracy even though the thickness of the metal silicide layer 41 is about 15 nm.

Further, the present inventors have investigated a semiconductor device according to the comparative example manufactured as stated above and have found that NiSi$_2$ is likely to grow abnormally from an NiSi layer 141b toward a channel section.

FIG. 25 schematically shows a region where NiSi$_2$ is likely to grow abnormally as an NiSi$_2$ abnormal growth region 141c. The appearance of such an NiSi$_2$ abnormal growth region 141c has been confirmed through experiments (sectional observation, composition analysis of a section, and others of a semiconductor device) by the present inventors. Then, it has been found also that, when NiSi$_2$ grows abnormally from an NiSi layer 141b toward a channel section, leak current between source and drain regions of a MISFET increases, the diffusion resistance of the source/drain region increases, and the yield of a device lowers.

When an NiSi layer 141b is formed through a salicide process of a whole reaction type with a lamp-type annealing apparatus 36 like the comparative example, an NiSi$_2$ abnormal growth region 141c is likely to be formed from the NiSi layer 141b toward the channel region of an n-channel MISFET and leak current is likely to occur. It has been confirmed by the present inventors that, when the thickness of an NiSi layer 141b formed by the method of the comparative example is about 22 nm or less in particular, as the thickness of the NiSi layer 141b decreases, such abnormal growth is likely to appear and the number of leak defects increases. This is because, if the thickness of the NiSi layer 141b is reduced to about 22 nm or less, the volume of a silicide layer reduces, hence reaction between an Ni film 112 and n+-type semiconductor regions 9b, p+-type semiconductor regions 10b, and gate electrodes 8a and 8b is likely to advance due to heat, and further crystals are likely to grow. On this occasion, as the crystal grain sizes of NiSi formed through the first step heat treatment increase, abnormal growth appears more conspicuously.

Consequently in the present embodiment, as stated above, a metal film 12 is deposited over the main surface of a semiconductor substrate 1 including over gate electrodes 8a and 8b, n+-type semiconductor regions 9b, and p+-type semiconductor regions 10b, thereafter a first heat treatment is applied with a thermal conductive annealing apparatus 20, and a metal silicide layer 41 containing microcrystals of NiSi is formed through the first heat treatment. That is, a metal silicide layer 41 is formed by selectively reacting a metal film 12 with gate electrodes 8a and 8b, n+-type semiconductor regions 9b, and p+-type semiconductor regions 10b (silicon configuring those) through the first heat treatment and the metal silicide layer 41 is changed to a layer where microcrystals of NiSi (nickel monosilicide) are contained in a metal rich phase comprising the phases of Ni$_2$Si (dinickel silicide) and NiSi$_2$ (nickel disilicide) at the stage of the first heat treatment.

Figure 26:
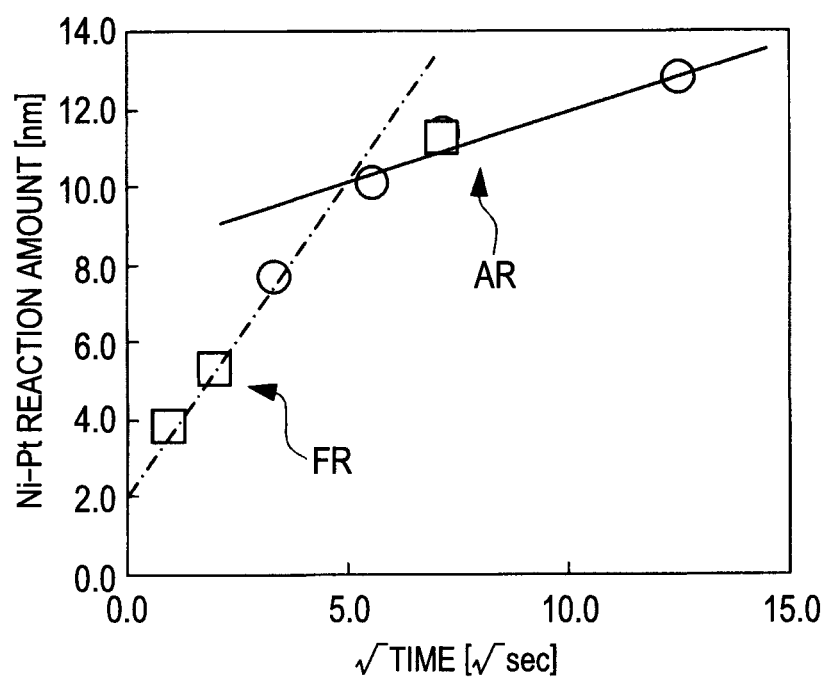
FIG. 26 is a graph showing a relationship between a heating time and an amount of reaction between Ni—Pt and a semiconductor substrate.
Figure 27A:
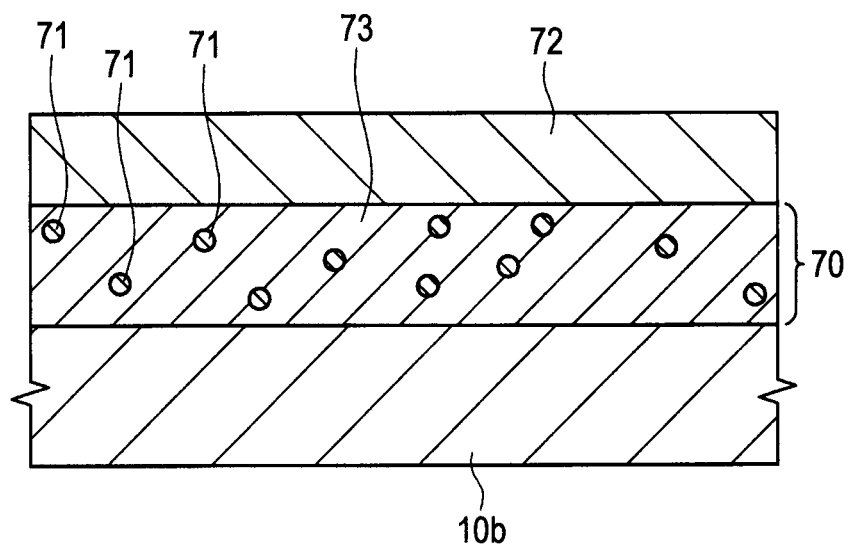
FIG. 27($a$) is an enlarged sectional view showing a substantial part of a semiconductor device during heat treatment under the same conditions as those in FIG. 26.
Figure 27B:
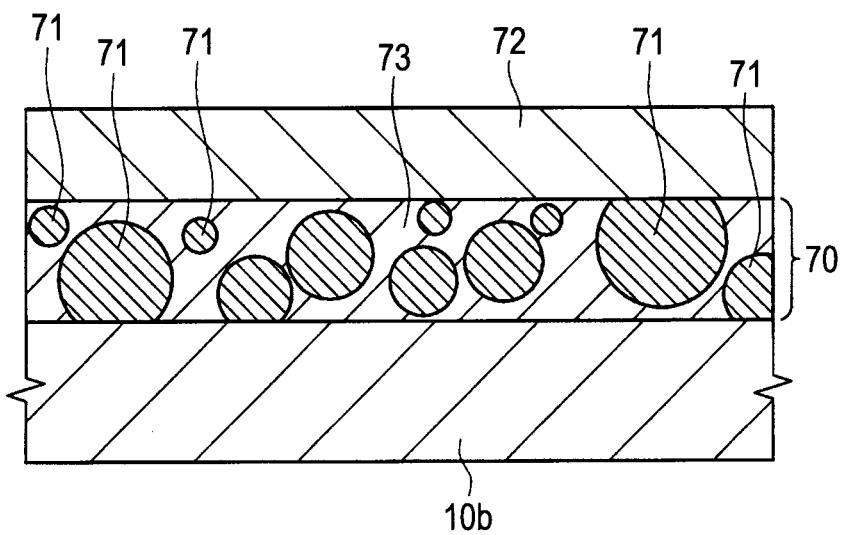

Here, the principle of forming microcrystals of NiSi or crystals having crystal grain sizes larger than the microcrystals in a metal silicide layer 41 is explained in reference to FIGS. 18(a), 18(b), 26, 27(a), and 27(b). FIG. 26 is a graph showing the relationship between a heating time and an amount of reaction between Ni—Pt in a metal film and a semiconductor substrate when the semiconductor substrate is heat-treated at a temperature of 200° C. or higher. Further, FIGS. 27(a) and 27(b) are enlarged sectional views showing a substantial part in the vicinity of a metal silicide layer 70 and a metal film 72 formed over the upper plane of a p+-type semiconductor region 10b of a p-channel MOSFET during heat treatment under the same condition as FIG. 26. FIG. 27(a) shows a metal silicide layer 70 at the beginning of reaction during heat treatment and FIG. 27(b) shows a metal silicide layer 70 at the latter half of the reaction heated for a longer period of time than FIG. 27(a).

When a heat treatment of 200° C. or higher is applied, the region FR and the region AR shown in FIG. 26 exist and the diffusion coefficients of Ni are different from each other. The diffusion coefficients are different from each other because a metal silicide layer comprises an Ni$_2$Si metal rich phase and microcrystals of NiSi (nuclei of NiSi) formed therein in the region FR and in contrast a metal silicide layer comprises NiSi having largely grown crystals and the metal rich phase in the region AR. The NiSi microcrystals do not grow large as the crystals of NiSi unless free energy for forming critical nuclei is exceeded, but the crystal grain sizes grow large as the crystals of NiSi when critical free energy is once exceeded as seen in the region AR shown in FIG. 26.

Consequently, at the beginning of reaction after a short time from the commencement of heating in a heat treatment (in the region FR shown in FIG. 26), the diffusion coefficient of Ni atoms diffusing in an $Ni_2Si$ metal rich phase increases and, at the latter half of the reaction after a long time from the commencement of the heating (in the region AR shown in FIG. 26), the crystals of NiSi grow and the diffusion coefficient in the $Ni_2Si$ metal rich phase decreases. That is, whereas NiSi crystals 71 in a metal silicide layer 70 containing an $Ni_2Si$ metal rich phase 73 are microcrystals having crystal grain sizes of several tens nanometers at the beginning of reaction in a heat treatment as shown in FIG. 27(a), the NiSi crystals 71 in the metal silicide layer 70 grow up to several microns in crystal gran size in the case of large crystals at the latter half of the reaction in the heat treatment as shown in FIG. 27(b).

From the above facts, it is understood that the crystal grain sizes of NiSi increase as the time for heat treatment increases. That is, the grain sizes of NiSi crystals once having grown through a first heat treatment never reduce thereafter and larger NiSi crystals are formed through a second heat treatment. In contrast, if a second heat treatment is applied in the state where NiSi microcrystals are formed through a first heat treatment, it is possible to form NiSi having small crystal grain sizes after the second heat treatment. That is, although the first heat treatment is finished when reaction advances up to the state shown in FIG. 27(a) in the first heat treatment of the present embodiment, the reaction advances up to the state shown in FIG. 27(b) at a first step heat treatment of the comparative example and the first step heat treatment ends when NiSi having large crystal grain sizes is formed.

In this way, in order to form microcrystals of NiSi through a first heat treatment, it is necessary to apply heat treatment for a relatively short period of time at a low temperature not exceeding free energy for forming critical nuclei of NiSi. Whereas an uncontrollable region exists at around 260° C. in a lamp-type annealing apparatus 36 as shown in FIG. 18(a), in a thermal conductive annealing apparatus 20, an uncontrollable region does not exist as shown in FIG. 18(b), a thermal budget reduces, and hence it is possible to apply heat treatment for a relatively short period of time at a low temperature not exceeding free energy for forming critical nuclei of NiSi.

In the present embodiment, a metal silicide layer 41 turns to an NiSi phase by applying a second heat treatment after a first heat treatment but, since the growth of the crystals of NiSi is inhibited through the first heat treatment, the crystal grain sizes of the microcrystals of NiSi formed in the metal silicide layer 41 after the first heat treatment of the present embodiment are extremely smaller than those of the crystals of NiSi formed in an $Ni_2Si$ layer 141a after the first step heat treatment of the comparative example. This is because NiSi formed through the first step heat treatment of the comparative example is heated for a longer period of time than necessary with a lamp-type annealing apparatus 36. In the present embodiment, since microcrystals of NiSi having small crystal grain sizes are formed in the first heat treatment with a thermal conductive annealing apparatus 20, the crystal grain sizes of NiSi in a metal silicide layer 41 after the second heat treatment are also smaller than the crystal grain sizes of NiSi in an NiSi layer 141b after the second step heat treatment of the comparative example.

Further, since the thickness of a silicide layer can be controlled by the temperature and the time of a heat treatment in the case of a salicide process of a partial reaction type, the use of a thermal conductive annealing apparatus 20 is advantageous because the thickness of a silicide layer can be controlled more accurately in the reduction of the thickness of the silicide layer than a salicide process of a whole reaction type to control the thickness of a silicide layer by the thickness of a metal film formed over a semiconductor substrate. This is because a temperature at a heat treatment is hardly controllable and a heating time increases in the case of a lamp-type annealing apparatus 36, and such a lamp-type annealing apparatus 36 is unsuitable for a salicide process of a partial reaction type requiring an accurate heating time.

Further, an $NiSi_2$ abnormal growth region 141c tends to be formed in the case where crystals of NiSi grow large by long time heating like the comparative example. In contrast, nickel silicide can: be stable physically by reducing the crystal grain sizes of NiSi in a silicide layer; and inhibit abnormal growth. In the present embodiment, an $NiSi_2$ abnormal growth region 141c is prevented from forming by preventing the crystals of nickel silicide in a metal silicide layer 41 from growing large, thereby leak current can be prevented from occurring, and thereby the reliability of a semiconductor device can be improved. Furthermore, thereby a metal silicide layer 41 having a thickness of about 22 nm or less can be formed in a physically stable state. Consequently, even a metal silicide layer 41 having a thickness of about 15 nm can be formed by accurately controlling the thickness, hence a MISFET can be miniaturized, the operation speed of a semiconductor device can be improved by the miniaturization, and the performance of the semiconductor device can be improved.

Then, when a metal film 12 is an Ni film or an Ni alloy film, in particular an Ni (nickel) film, an Ni—Pt (nickel-platinum) alloy film, an Ni—Pd (nickel-palladium) alloy film, an Ni—Y (nickel-yttrium) alloy film, an Ni—Yb (nickel-ytterbium) alloy film, an Ni—Er (nickel-erbium) alloy film, or an Ni-lanthanoid alloy film, a large effect can be obtained by applying the present embodiment. When a metal film 12 is an Ni—Pt alloy film in particular, Pt can reduce the crystal grain sizes of NiSi formed in a metal silicide layer 41.

Further, an $NiSi_2$ abnormal growth region 141c extending from an NiSi layer 141b toward a channel section as shown in FIG. 25 is more likely to form in an n-channel MISFET than in a p-channel MISFET. It is estimated that reaction between Ni and Si advances more in a p-type silicon region than in an n-type silicon region at a low temperature and Ni is more likely to diffuse in the p-type silicon region than in the n-type silicon region. Consequently, an $NiSi_2$ abnormal growth region 141c is more likely to appear in a p-type well 5 where Ni is more likely to diffuse than in an n-type well 6 and the effect of preventing abnormal growth of $NiSi_2$ from a metal silicide layer 41 toward a channel section when the present embodiment is applied is larger in an n-channel MISFETQn than in a p-channel MISFETQp.

The invention established by the present inventors has heretofore been explained concretely on the basis of an embodiment but it goes without saying that the present invention is not limited to the embodiment and can be modified variously within the range not deviating from the gist.

The present invention is effectively applied to a manufacturing technology of a semiconductor device provided with a semiconductor element having a metal silicide layer.

What is claimed is:

1. A manufacturing method of a semiconductor device, comprising the steps of:
   (a) preparing a semiconductor substrate;
   (b) forming a semiconductor region in the semiconductor substrate;
   (c) forming a metal film over the semiconductor substrate including over the semiconductor region;

(d) forming a metal silicide layer at the upper part of the semiconductor region by applying a first heat treatment and selectively reacting the metal film with the semiconductor region;

(e) after the process (d), removing the unreacted part of the metal film and keeping the metal silicide layer over the semiconductor region;

(f) after the process (e), applying a second heat treatment, the heat treatment temperature of which is higher than that of the first heat treatment; and (g) after the process (f), forming an insulation film over the semiconductor substrate including over the metal silicide layer, wherein the first heat treatment in the process (d) is applied at 250° C. to 300° C., wherein a temperature-rise rate in an annealing apparatus for applying the first heat treatment in the process (d) is 250° C./sec, to 500° C./sec., wherein the metal silicide layer formed through the first heat treatment in the process (d) contains NiSi, and wherein crystal grain sizes of NiSi in the metal silicide layer formed through the first heat treatment in the process (d) are not more than one third of crystal grain sizes of NiSi in the metal silicide layer after the second heat treatment in the process (f).

2. A manufacturing method of a semiconductor device according to claim 1, wherein, in the annealing apparatus for applying the first heat treatment in the process (d), heaters to heat the semiconductor device attain a target temperature for heat-treating the semiconductor device already when the semiconductor substrate is charged in the annealing apparatus.

3. A manufacturing method of a semiconductor device according to claim 1, wherein, in the annealing apparatus for applying the first heat treatment in the process (d), the semiconductor substrate is heat-treated by disposing conductors in respective vicinities on a main surface side and a back surface side of the semiconductor substrate, applying electric current to the conductors, and making the conductors generate heat.

4. A manufacturing method of a semiconductor device according to claim 3, wherein the conductors can move in directions perpendicular to the main surface of the semiconductor substrate charged in the annealing apparatus, and, after the semiconductor substrate is charged in the annealing apparatus, heat treatment is applied by moving the conductors close to the main surface and the back surface of the semiconductor substrate respectively.

5. A manufacturing method of a semiconductor device according to claim 1, wherein, in the annealing apparatus for applying the first heat treatment in the process (d), the heat treatment is applied with carbon heaters or by resistance heating.

6. A manufacturing method of a semiconductor device according to claim 1, wherein the annealing apparatus for applying the first heat treatment in the process (d) is a sheet-type annealing apparatus.

7. A manufacturing method of a semiconductor device according to claim 1, wherein, in the process (d), the metal silicide layer is formed by reacting a part of the thickness of the metal film formed over the semiconductor region with the semiconductor region.

8. A manufacturing method of a semiconductor device according to claim 1, wherein, at the first heat treatment in the process (d), overshoot, which means that a temperature of the semiconductor substrate exceeds a heat treatment temperature, does not occur.

9. A manufacturing method of a semiconductor device according to claim 1, wherein a gate electrode is formed over the semiconductor substrate while a gate insulation film is interposed between the gate electrode and the semiconductor substrate after the process (b) and before the process (c), wherein the metal film is formed over the semiconductor substrate and simultaneously the metal film is formed over the gate electrode in the process (c), wherein the metal silicide layer is formed at the upper part of the gate electrode by reacting the metal film formed over the gate electrode with the gate electrode in the process (d), and wherein the unreacted part of the metal film formed over the gate electrode is removed and the metal silicide layer remains at the upper part of the gate electrode in the process (d).

10. A manufacturing method of a semiconductor device according to claim 1, wherein the metal film contains an alloy of Ni and Pt.

11. A manufacturing method of a semiconductor device, comprising the steps of:

(a) preparing a semiconductor substrate;

(b) forming a semiconductor region in the semiconductor substrate;

(c) forming a metal film over the semiconductor substrate including over the semiconductor region;

(d) forming a metal silicide layer at the upper part of the semiconductor region by applying a first heat treatment having a first heat treatment temperature, and selectively reacting the metal film with the semiconductor region;

(e) after the process (d), removing the unreacted part of the metal film and keeping the metal silicide layer over the semiconductor region;

(f) after the process (e), applying a second heat treatment, the heat treatment temperature of which is higher than that of the first heat treatment; and (g) after the process (f), forming an insulation film over the semiconductor substrate including over the metal silicide layer, wherein the time taken for the temperature of the semiconductor substrate in the process (d) to reach the first heat treatment temperature for reacting the metal film with the semiconductor region from a temperature of the semiconductor substrate immediately before commencement of the first heat treatment is less than one second, and wherein crystal grain sizes in the metal silicide layer formed through the first heat treatment in the process (d) are not more than one third of crystal grain sizes in the metal silicide layer after the second heat treatment in the process (f).

12. A manufacturing method of a semiconductor device according to claim 11, wherein, in an annealing apparatus for applying the first heat treatment in the process (d), the semiconductor substrate is heat-treated by disposing conductors in respective vicinities on a main surface side and a back surface side of the semiconductor substrate, applying electric current to the conductors, and making the conductors generate heat.

13. A manufacturing method of a semiconductor device according to claim 11, wherein, in an annealing apparatus for applying the first heat treatment in the process (d), the heat treatment is applied with carbon heaters or by resistance heating.

14. A manufacturing method of a semiconductor device according to claim 11, wherein the metal silicide layer formed through the first heat treatment in the process (d) contains NiSi.

15. A manufacturing method of a semiconductor device according to claim 11, wherein, in the process (d), the metal silicide layer is formed by reacting a part of the thickness of the metal film formed over the semiconductor region with the semiconductor region.

16. A manufacturing method of a semiconductor device according to claim 11, wherein, at the first heat treatment in the process (d), overshoot, which means that a temperature of the semiconductor substrate exceeds a heat treatment temperature, does not occur.

17. A manufacturing method of a semiconductor device according to claim 16, wherein crystal grain sizes of NiSi in the metal silicide layer formed through the first heat treatment in the process (d) are not more than one third of crystal grain sizes of NiSi in the metal silicide layer after the second heat treatment in the process (f).

18. A manufacturing method of a semiconductor device according to claim 11, wherein a gate electrode is formed over the semiconductor substrate while a gate insulation film is interposed between the gate electrode and the semiconductor substrate after the process (b) and before the process (c), wherein the metal film is formed over the semiconductor substrate and simultaneously the metal film is formed over the gate electrode in the process (c), wherein the metal silicide layer is formed at the upper part of the gate electrode by reacting the metal film formed over the gate electrode with the gate electrode in the process (d), and wherein unreacted part of the metal film over the gate electrode is removed and the metal silicide layer remains at the upper part of the gate electrode in the process (d).

* * * * *